(12) United States Patent
Nakata et al.

(10) Patent No.: US 8,812,151 B2
(45) Date of Patent: Aug. 19, 2014

(54) VACUUM PROCESS DEVICE AND VACUUM PROCESS METHOD

(75) Inventors: Teruo Nakata, Yohohama (JP); Keita Nogi, Tokyo (JP); Satomi Inoue, Kudamatsu (JP); Michinori Kawaguchi, Shunan (JP)

(73) Assignee: Hitachi High-Technologies Corporation, Tokyo (JP)

( * ) Notice: Subject to any disclaimer, the term of this patent is extended or adjusted under 35 U.S.C. 154(b) by 75 days.

(21) Appl. No.: 13/479,518

(22) Filed: May 24, 2012

(65) Prior Publication Data
US 2012/0303158 A1    Nov. 29, 2012

(30) Foreign Application Priority Data

May 26, 2011    (JP) .................................. 2011-117755

(51) Int. Cl.
*G06F 7/00*    (2006.01)
*G06F 19/00*    (2011.01)

(52) U.S. Cl.
USPC ........... 700/228; 700/213; 700/229; 700/230; 700/245

(58) Field of Classification Search
None
See application file for complete search history.

(56) References Cited

U.S. PATENT DOCUMENTS

2008/0112780 A1*  5/2008  Matano et al. ............. 414/217.1
2011/0218662 A1*  9/2011  Nakata et al. ................. 700/112

FOREIGN PATENT DOCUMENTS

| JP | 10-189687 | 7/1998 |
| JP | 2002-506285 | 2/2002 |
| JP | 2007-59764 | 3/2007 |
| JP | 2007-511104 | 4/2007 |
| WO | WO 99/45575 | 9/1999 |
| WO | WO 2005/048313 A2 | 5/2005 |

OTHER PUBLICATIONS

An Office Action issued in Japanese Patent Application No. 2011-117755 on Aug. 6, 2013.

* cited by examiner

*Primary Examiner* — Yolanda Cumbess
(74) *Attorney, Agent, or Firm* — Antonelli, Terry, Stout & Kraus, LLP.

(57) ABSTRACT

An efficient method of controlling transportation in a linear tool type vacuum process device in a state that a length of time required for a process is not stable. For each process chamber, the number of unprocessed wafers that are in process or are being transported to the process chamber is counted, and in deciding a transport destination of a wafer, when the number of unprocessed wafers is equal to or larger than a charge limit amount, a transport destination of a wafer is decided excluding the process chamber. Also, a wafer holding mechanism on a transport path to a process chamber is reserved, and a transport destination of a processed member to be transported next is decided according to a status of reservation.

12 Claims, 24 Drawing Sheets

FIG. 13

DEVICE STATE INFORMATION

1301

| PORTION | STATE | WAFER NUMBER | WAFER STATE |
|---|---|---|---|
| LOAD PORT 201_STEP 1 | — | W1 | PROCESS COMPLETED |
| LOAD PORT 201_STEP 2 | — | EMPTY | — |
| ⋮ | ⋮ | ⋮ | ⋮ |
| LOAD PORT 201_STEP 25 | — | W25 | UNPROCESSED |
| LOAD PORT 202_STEP 1 | — | W26 | UNPROCESSED |
| ⋮ | ⋮ | ⋮ | ⋮ |
| LOAD PORT 202_STEP 25 | — | W50 | UNPROCESSED |
| ATMOSPHERE ROBOT 203 | IN TRANSPORTATION | W12 | UNPROCESSED |
| LOAD LOCK 211_STEP 1 | VACUUM | W10 | UNPROCESSED |
| ⋮ | ⋮ | ⋮ | ⋮ |
| LOAD LOCK 211_STEP 5 | VACUUM | W2 | PROCESS COMPLETED |
| PROCESS CHAMBER 205 | IN PROCESS | W5 | IN PROCESS |
| PROCESS CHAMBER 206 | CLEANING | EMPTY | — |
| ⋮ | ⋮ | ⋮ | ⋮ |
| PROCESS CHAMBER 210 | STAND-BY | EMPTY | — |
| VACUUM ROBOT 217_HAND 1 | STAND-BY | EMPTY | — |
| VACUUM ROBOT 217_HAND 2 | IN TRANSPORTATION | W3 | PROCESS COMPLETED |
| VACUUM ROBOT 218_HAND 1 | IN TRANSPORTATION | W8 | UNPROCESSED |
| VACUUM ROBOT 218_HAND 2 | IN TRANSPORTATION | W7 | UNPROCESSED |
| VACUUM ROBOT 219_HAND 1 | STAND-BY | EMPTY | — |
| VACUUM ROBOT 219_HAND 2 | STAND-BY | EMPTY | — |
| BUFFER ROOM 212_STEP 1 | — | W4 | PROCESS COMPLETED |
| ⋮ | ⋮ | ⋮ | ⋮ |
| BUFFER ROOM 212_STEP 5 | — | EMPTY | — |
| BUFFER ROOM 213_STEP 1 | — | W6 | UNPROCESSED |
| ⋮ | ⋮ | ⋮ | ⋮ |
| BUFFER ROOM 213_STEP 5 | — | EMPTY | — |

FIG. 14

PROCESS SUBJECT INFORMATION

| 1401 ~ | WAFER NUMBER |
|---|---|
| | W1 |
| | W2 |
| | W3 |
| | W4 |
| | W5 |
| | W6 |
| | W7 |
| | . |
| | . |
| | . |
| | W22 |
| | W23 |
| | W24 |
| | W25 |

FIG. 15

PROCESS CHAMBER INFORMATION

| 1501 ~ | PROCESS CHAMBER NUMBER | STATE |
|---|---|---|
| | PROCESS CHAMBER 205 | ACTIVE |
| | PROCESS CHAMBER 206 | ACTIVE |
| | PROCESS CHAMBER 207 | ACTIVE |
| | PROCESS CHAMBER 208 | ACTIVE |
| | PROCESS CHAMBER 209 | INACTIVE |
| | PROCESS CHAMBER 210 | INACTIVE |

FIG. 16

TRANSPORT DESTINATION INFORMATION

| WAFER NUMBER | TRANSPORT DESTINATION |
|---|---|
| W1 | PROCESS CHAMBER 205 |
| W2 | PROCESS CHAMBER 207 |
| W3 | PROCESS CHAMBER 206 |
| W4 | PROCESS CHAMBER 208 |
| W5 | PROCESS CHAMBER 205 |
| W6 | PROCESS CHAMBER 206 |
| W7 | PROCESS CHAMBER 207 |

OPERATION INSTRUCTION INFORMATION

| OPERATION INSTRUCTION | TRANSPORT SUBJECT |
|---|---|
| TRANSPORT FROM LOAD LOCK 211 TO BUFFER ROOM 212 | W10 |
| TRANSPORT FROM PROCESS CHAMBER 205 TO LOAD LOCK 211 | W5 |

OPERATION INSTRUCTION RULE

1801

| OPERATION INSTRUCTION | OPERATION INSTRUCTION CONDITION |
|---|---|
| TRANSPORT FROM LOAD LOCK 211 TO PROCESS CHAMBER 205 | THERE IS AN UNPROCESSED WAFER Wx WHOSE TRANSPORT DESTINATION IS PROCESS CHAMBER 205 IN LOAD LOCK 211 WHICH IS IN VACUUM |
| | PROCESS CHAMBER 205 IS STANDING BY |
| | AT LEAST ONE HAND OF VACUUM ROBOT 217 IS STANDING BY |
| TRANSPORT FROM LOAD LOCK 211 TO BUFFER ROOM 212 | THERE IS UNPROCESSED WAFER Wx WHOSE TRANSPORT DESTINATION IS NOT PROCESS CHAMBERS 205 AND 206 IN LOAD LOCK 211 WHICH IS IN VACUUM |
| | THERE IS AVAILABLE HOLDING STEP IN BUFFER ROOM 212 |
| | AT LEAST ONE HAND OF VACUUM ROBOT 217 IS STANDING BY |
| TRANSPORT FROM PROCESS CHAMBER 205 TO LOAD LOCK 211 | THERE IS PROCESSED WAFER Wx IN PROCESS CHAMBER 205 |
| | THERE IS AVAILABLE STEP IN LOAD LOCK 211 WHICH IS IN VACUUM |
| | AT LEAST ONE HAND OF VACUUM ROBOT 217 IS STANDING BY |
| ... | ... |

FIG. 19

OPERATION SEQUENCE INFORMATION

1901

| OPERATION INSTRUCTION: TRANSPORT FROM LOAD LOCK 211 TO BUFFER ROOM 212 | | |
|---|---|---|
| OPERATION ORDER | PORTION | OPERATION |
| 1 | LOAD-LOCK 211 | OPEN VACUUM-SIDE GATE VALVE 221 |
| 1 | VACUUM ROBOT 217 | ROTATE TO FACE LOAD LOCK 211 |
| 2 | VACUUM ROBOT 217 | TAKE OUT WAFER FROM LOAD LOCK 211 |
| 3 | VACUUM ROBOT 217 | ROTATE TO FACE BUFFER ROOM 212 |
| 3 | BUFFER ROOM 212 | OPEN GATE VALVE 224 ON THE SIDE OF TRANSPORT CHAMBER 214 |
| 3 | LOAD-LOCK 211 | CLOSE VACUUM-SIDE GATE VALVE 221 |
| 4 | VACUUM ROBOT 217 | PLACE WAFER IN BUFFER ROOM 212 |
| 5 | BUFFER ROOM 212 | CLOSE GATE VALVE 224 ON THE SIDE OF TRANSPORT CHAMBER 214 |

FIG. 20

UNPROCESSED WAFER AMOUNT INFORMATION

| PROCESS CHAMBER NUMBER | UNPROCESSED WAFER AMOUNT |
|---|---|
| PROCESS CHAMBER 205 | 1 |
| PROCESS CHAMBER 206 | 2 |
| PROCESS CHAMBER 207 | 2 |
| PROCESS CHAMBER 208 | 1 |
| PROCESS CHAMBER 209 | 1 |
| PROCESS CHAMBER 210 | 1 |

ALLOCATION-SUBJECT PROCESS CHAMBER INFORMATION

| PROCESS CHAMBER NUMBER |
|---|
| PROCESS CHAMBER 205 |
| PROCESS CHAMBER 208 |

CHARGE LIMIT AMOUNT INFORMATION

| PROCESS CHAMBER NUMBER | CHARGE LIMIT AMOUNT |
|---|---|
| PROCESS CHAMBER 205 | 2 |
| PROCESS CHAMBER 206 | 2 |
| PROCESS CHAMBER 207 | 2 |
| PROCESS CHAMBER 208 | 2 |
| PROCESS CHAMBER 209 | 2 |
| PROCESS CHAMBER 210 | 2 |

HOLDABLE WAFER AMOUNT INFORMATION

| BLOCK NUMBER | HOLDABLE WAFER AMOUNT |
|---|---|
| BLOCK 1 | 2 |
| BLOCK 2 | 2 |
| BLOCK 3 | 2 |

BLOCK INFORMATION

| BLOCK NUMBER | PORTION |
|---|---|
| BLOCK 1 | LOAD LOCK 211 |
| BLOCK 1 | TRANSPORT CHAMBER 214 |
| BLOCK 1 | PROCESS CHAMBER 205 |
| BLOCK 1 | PROCESS CHAMBER 206 |
| BLOCK 2 | BUFFER ROOM 212 |
| BLOCK 2 | TRANSPORT CHAMBER 215 |
| BLOCK 2 | PROCESS CHAMBER 207 |
| BLOCK 2 | PROCESS CHAMBER 208 |
| BLOCK 3 | BUFFER ROOM 213 |
| BLOCK 3 | TRANSPORT CHAMBER 216 |
| BLOCK 3 | PROCESS CHAMBER 209 |
| BLOCK 3 | PROCESS CHAMBER 210 |

2401

FIG. 29
TRANSPORT DESTINATION PATH INFORMATION

| TRANSPORT DESTINATION | PATH INFORMATION |
|---|---|
| PROCESS CHAMBER 205 | LOAD LOCK 211 |
| PROCESS CHAMBER 206 | LOAD LOCK 211 |
| PROCESS CHAMBER 206 | BUFFER ROOM 212 |
| PROCESS CHAMBER 207 | LOAD LOCK 211 |
| PROCESS CHAMBER 207 | BUFFER ROOM 212 |
| PROCESS CHAMBER 207 | BUFFER ROOM 213 |
| PROCESS CHAMBER 208 | LOAD LOCK 211 |
| PROCESS CHAMBER 209 | LOAD LOCK 211 |
| PROCESS CHAMBER 209 | BUFFER ROOM 212 |
| PROCESS CHAMBER 210 | LOAD LOCK 211 |
| PROCESS CHAMBER 210 | BUFFER ROOM 212 |
| PROCESS CHAMBER 210 | BUFFER ROOM 213 |

2901

FIG. 30
RESERVATION INFORMATION

| HOLDING MECHANISM | RESERVATION |
|---|---|
| LOAD LOCK 211 STEP 1 | W1 |
| LOAD LOCK 211 STEP 2 | BLANK |
| ... | ... |
| LOAD LOCK 211 STEP N | W2 |
| BUFFER ROOM 212 STEP 1 | BLANK |
| BUFFER ROOM 212 STEP 2 | W4 |
| ... | ... |
| BUFFER ROOM 212 STEP N | BLANK |
| BUFFER ROOM 213 STEP 1 | W5 |
| BUFFER ROOM 213 STEP 2 | BLANK |
| ... | ... |
| BUFFER ROOM 213 STEP N | BLANK |

3001

VACUUM PROCESS DEVICE AND VACUUM PROCESS METHOD

CLAIM OF PRIORITY

The present application claims priority from Japanese patent application JP 2011-117755 filed on May 26, 2011, the content of which is hereby incorporated by reference into this application.

BACKGROUND OF THE INVENTION

1) Field of the Invention

The present invention relates to a vacuum process device, and in particular relates to a method of transporting semiconductor processed members (hereinafter, wafers) between process chambers and the like in a semiconductor process device.

2) Description of the Related Arts

A semiconductor process device, and in particular a device that processes wafers that are a process subject in a reduced pressure has been required to be more efficient in processing the process subject as processes become more minute and refined. As a result, in recent years, a multi-chamber device provided with a plurality of process chambers connected therein has been developed, and improvements have been made to make productivity per installation area of a clean room more efficient. In such a device that performs processes with a plurality of process chambers provided therein, a gas in each process chamber and the pressure are adjusted to a reduced pressure, and a transport chamber provided with a robot and the like for transporting wafers is connected thereto.

As such a multi-chamber device, a device with a cluster tool structure in which process chambers are connected radially along circumferences of transport chambers is widely used. However, the cluster tool type device requires a large installation area, and in particular the installation area has been becoming further larger as wafers are becoming larger in diameters in recent years. To address this problem, a device with a linear tool structure has appeared (for example, Japanese Unexamined Patent Application Publication No. 2007-511104). A characteristic of a linear tool is that the structure has a plurality of transport chambers, a process chamber is connected to each transport chamber, and the transport chambers are connected with each other directly or with spaces for receiving and passing wafers (hereinafter, buffer rooms) therebetween.

Although the linear tool structure has been proposed to make an installation area smaller, other proposals have been made to further improve productivity. Shortening of a process time and efficient transportation are important in improving productivity, and in particular many efficient transport methods have been proposed. Known representative methods use scheduling. The methods using scheduling are that a transport operation is decided in advance, and transportation is performed based on the decision. In an example of methods proposed, a transport operation is decided by allocating earlier, as a transport destination, a process chamber with a shorter process completion time (for example, Japanese Patent Application Laid-open Publication No. 10-189687).

The methods using scheduling can realize high productivity under a condition that lengths of time for etching and deposition are stable around standard lengths of time required for the processes. However, a process time often is not stable and becomes severalfold longer than standard lengths of time required for the processes when a new product is processed or processing conditions for wafers change. In such a situation, when a process time is extended in a process chamber among a plurality of process chambers, a wafer planned to be processed in the process chamber cannot be transported as scheduled, and has to wait in the device; as a result, a transport path of another wafer planned to be processed in another process chamber is blocked, and thus productivity is decreased.

Explaining specifically, for example, suppose that there are two process chambers, a process in a process chamber A is planned to end in 20 seconds, and a process in a process chamber B is planned to end in 50 seconds. At this time, it is supposed that a wafer W1 planned to be processed next in the process chamber A is waiting in a load lock. If the process in the process chamber A ends in 20 seconds as scheduled, the wafer W1 is taken out of the load lock, and the process is performed on the wafer W1 in the process chamber A. If this is the case, the load lock is emptied, and a wafer W2 to be processed next in the process chamber B can be taken in; accordingly, as soon as a process in the process chamber B ends, the wafer W2 can be processed in the process chamber B. However, if the process in the process chamber A does not end in 20 seconds as scheduled, the wafer W1 waiting in the load lock remains occupying the load lock, and the wafer W2 cannot enter the load lock. Accordingly, the process in the process chamber A is prolonged, and even if the process in the process chamber B ends earlier, the wafer W2 planned to be processed next in the process chamber B cannot be transported to the process chamber B, and cannot be processed. Therefore, productivity decreases.

As a solution for a case that a wafer planned to be processed in a process chamber is not transported as scheduled, and interferes with transportation of another wafer planned to be processed in another process chamber, a method of, when a wafer that cannot be transported as scheduled emerges, rescheduling a transport schedule by collecting a wafer that is not transported as scheduled or moving the wafer to a space for temporary evaluation has been proposed (Japanese Unexamined Patent Application Publication No. 2002-506285).

SUMMARY OF THE INVENTION

The above-described conventional techniques have problems below.

Even if a transport schedule is rescheduled to mitigate a decrease in productivity in a situation that a process time is not stable, operations that are not necessary originally of collecting wafers or transporting the wafers to a space for temporary evacuation are performed, a decrease in productivity cannot be avoided, and thus this cannot necessarily be said to be an efficient transport method.

Also, an efficient transport method differs depending on a process step of a wafer in some cases. A process step may complete by performing a process once in a process chamber, and otherwise a process step may complete by performing a process several times. Furthermore, an efficient transport method differs depending on an operation condition. In one operation condition, a process chamber where a process on a wafer is planned can be changed freely anytime, and otherwise in another operation condition, a process chamber where a process on a wafer is planned cannot be changed once the wafer starts to be transported from an initial position. An operation condition that a process chamber where a process on a wafer is planned can be changed freely anytime is applied when process conditions such as types of gases used for processes are the same for a plurality of process chambers, and qualities of wafers after the processes do not differ even if the wafers are processed in any process chamber. Also, an operation condition that a process chamber where a process on a wafer is planned cannot be changed once a wafer starts to be transported from an initial position is applied when, although process conditions such as types of gases used for processes are the same for a plurality of process chambers, process conditions are slightly adjusted depending on a wafer-specific condition such as a film thickness once a process chamber where a process on a wafer is planned is decided or when process conditions such as types of gases used for processes differ for process chambers.

An object of the present invention is to provide a linear tool type semiconductor process device with a high transport efficiency and a high throughput in which, at a process step that completes by performing a process once in a process chamber, under an operation condition that a process chamber where a process on a wafer is planned cannot be changed once transportation of the wafer is started from an initial position, in a situation that a process time is not stable, a wafer planned to be processed in a process chamber does not interfere with transportation of another wafer planned to be processed in another process chamber.

Even if a process time of a process chamber is prolonged, it is controlled not to block a transport path of a wafer transported to another process chamber by restricting the number of unprocessed wafers to be charged to each process chamber.

A device has, as units that restrict the number of unprocessed wafers to be charged to each process chamber: a unit that reserves for each process chamber and for each wafer a wafer holding mechanism in a load lock or buffer room on a transport path of the wafer to the process chamber before starting the transportation; a unit that restricts reservation of a holding mechanism in the common load lock or buffer room for a wafer planned to be transported to the same process chamber; a unit that restricts reservation so that all holding mechanisms in each load lock or buffer room are not reserved; and a unit that cancels reservation of a reserved holding mechanism when a process of a transport destination process chamber of the holding mechanism ends.

Furthermore, the units that restrict the number of unprocessed wafers to be charged to each process chamber do not charge a new unprocessed wafer when all holding mechanisms in any load lock or buffer room are reserved or all but one of holding mechanisms are reserved.

The present invention can provide a semiconductor process device with a high transport efficiency and a high throughput in which, in a situation that a process time is not stable, a wafer planned to be processed in a process chamber does not interfere with transportation of another wafer planned to be processed in another process chamber.

BRIEF DESCRIPTION OF THE DRAWINGS

FIG. 13 is a figure that shows an example of device state information;

FIG. 14 is a figure that shows an example of process subject information;

FIG. 15 is a figure that shows an example of process chamber information;

FIG. 16 is a figure that shows an example of transport destination information;

FIG. 17 is a figure that shows an example of operation instruction information;

FIG. 18 is a figure that shows an example of operation instruction rule information;

FIG. 19 is a figure that shows an example of operation sequence information;

FIG. 20 is a figure that shows an example of unprocessed wafer amount information;

FIG. 21 is a figure that shows an example of allocation-subject process chamber information;

FIG. 22 is a figure that shows an example of charge limit amount information;

FIG. 23 is a figure that shows an example of holdable wafer amount information;

FIG. 24 is a figure that shows an example of block information;

FIG. 29 is a figure that shows an example of transport destination path information; and FIG. 30 is a figure that shows an example of reservation information.

DETAILED DESCRIPTION OF THE PREFERRED EMBODIMENTS

Figure 1:
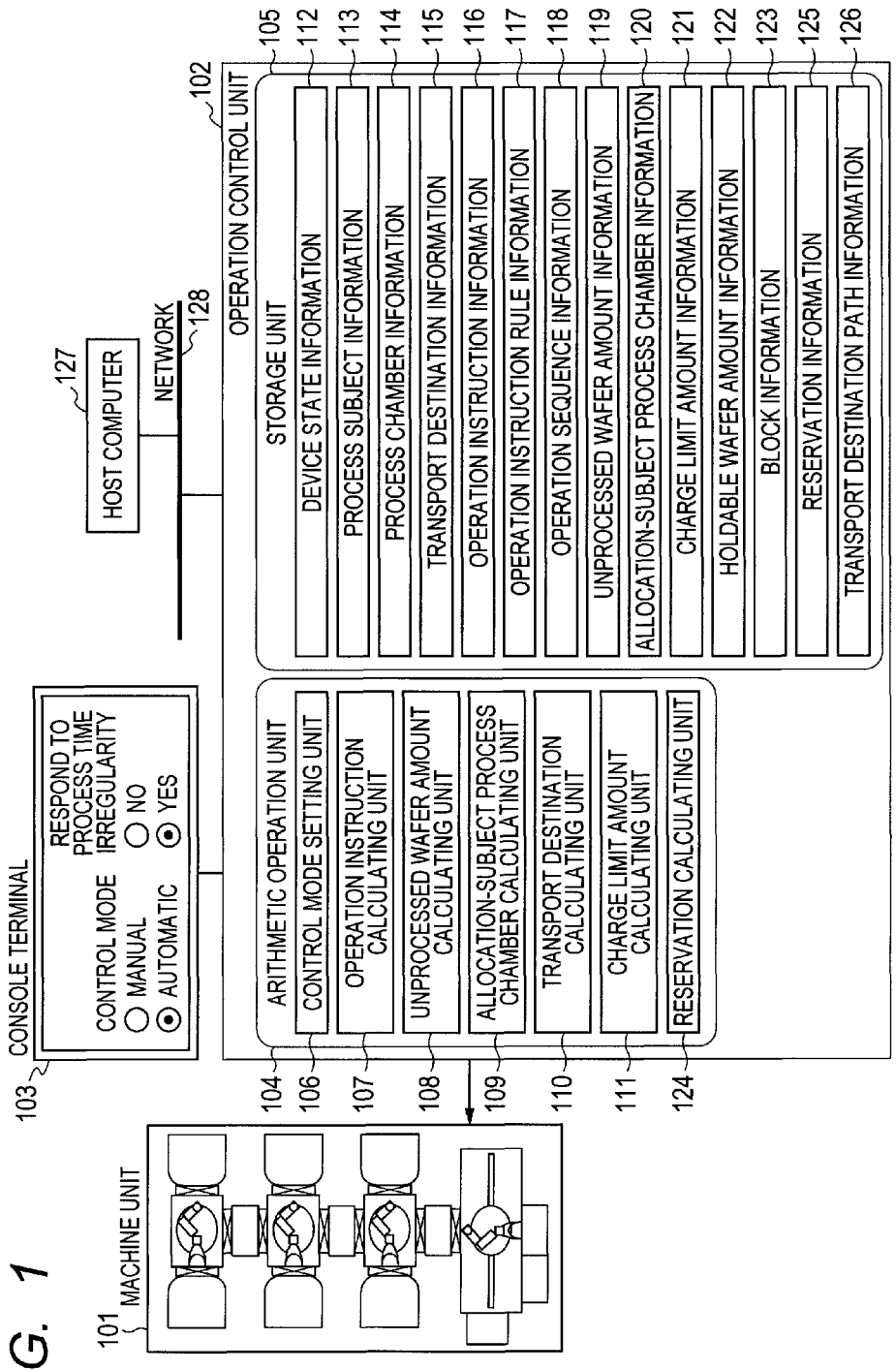
FIG. 1 is a figure for explaining a gist of an entire configuration of a semiconductor process device.

Hereinafter, an embodiment of the present invention is explained with reference to drawings.

A gist of an overall configuration of a semiconductor process device according to the present invention is explained with reference to FIG. 1. The semiconductor process device consists of, dividing generally, a machine unit 101 including process chambers and transport mechanisms, an operation control unit 102 and a console terminal 103. The machine unit 101 is configured with process chambers that can perform processes such as etching and deposition on wafers, and transport mechanisms provided with robots that perform transportation of wafers and the like. The operation control unit 102 is a controller that controls operations of the process chambers and the transport mechanisms, and consists of an arithmetic operation unit 104 that performs arithmetic operation processes, and a storage unit 105 that stores therein various kinds of information. The arithmetic operation unit 104 includes: a control mode setting unit 106 that switches internal processes of a control system depending on control modes of "manual" and "automatic" designated by a user; an operation instruction calculating unit 107 that performs arithmetic operations for actually operating the process chambers and the transport mechanisms; an unprocessed wafer amount calculating unit 108 that calculates an unprocessed wafer amount; an allocation-subject process chamber calculating unit 109 that calculates a process chamber to be a candidate of a transport destination of a wafer to be newly charged; a transport destination calculating unit 110 that calculates a transport destination process chamber of a wafer to be newly charged; a charge limit amount calculating unit 111 that computes a charge limit amount that restricts the number of wafers planned to be charged to each process chamber; and a reservation calculating unit 124 that calculates to reserve a holding mechanism for each wafer in a load lock and a buffer room that the wafer goes through when the wafer is transported to a process chamber. Also, the storage unit 105 stores therein device state information 112, process subject information 113, process chamber information 114, transport destination information 115, operation instruction information 116, operation instruction rule information 117, operation sequence information 118, unprocessed wafer amount information 119, allocation-subject process chamber information 120, charge limit amount information 121, holdable wafer amount information 122, block information 123, reservation information 125, and transport destination path information 126. The console terminal 103 is for a user to input a control method and to confirm a state of the device, and is provided with input equipment such as a keyboard, a mouse and a touch pen, and a display to output information. Also, the semiconductor process device is connected to a host computer 127 through a network 128, and can download, from the host computer 127 when needed, necessary information such as recipes about types of gases to be used for processes, concentrations thereof, and the like, and standard lengths of time required for the processes.

Figure 2:
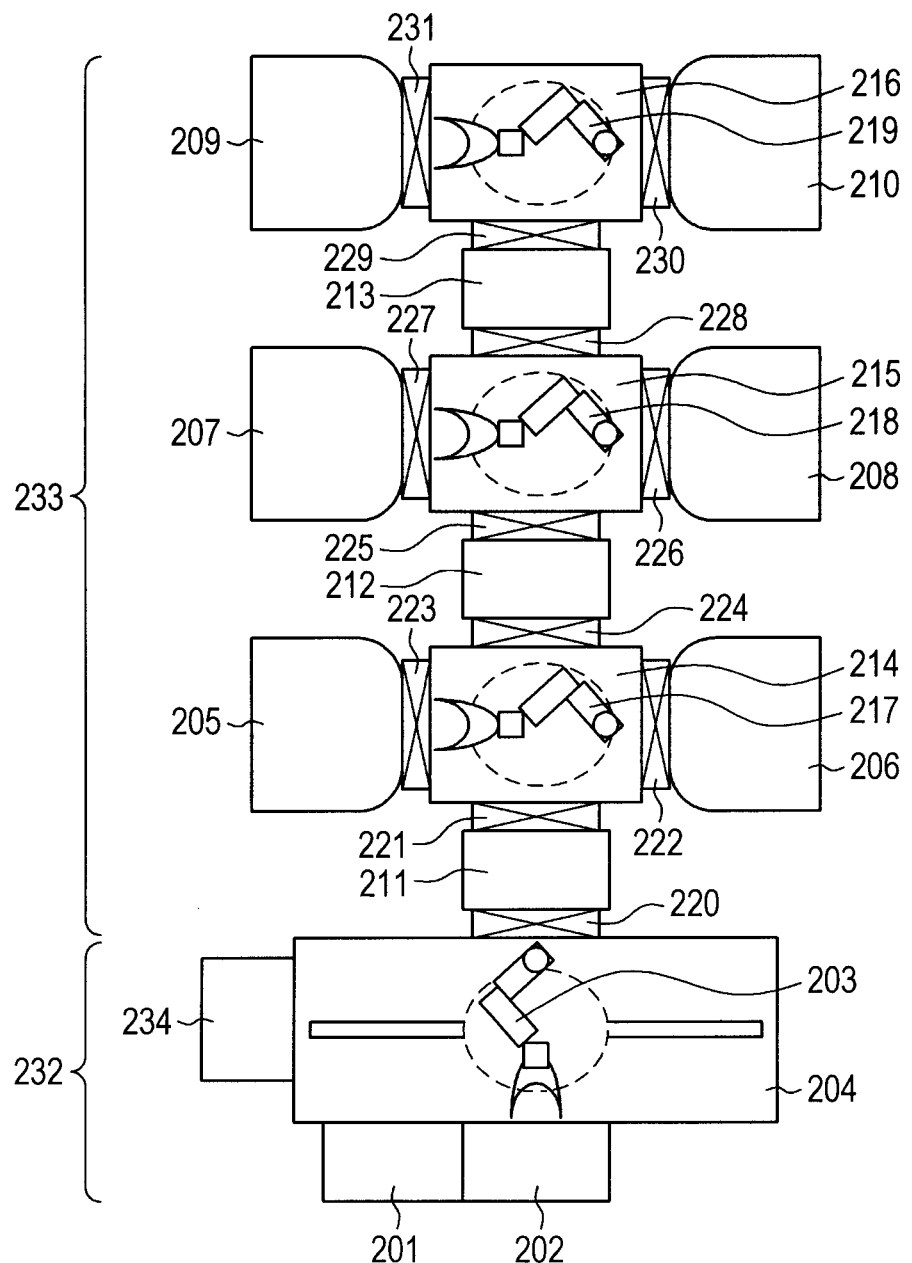
FIG. 2 is a figure for explaining a configuration of a machine unit of the semiconductor process device.

Next, a configuration of a machine unit including process chambers and transport mechanisms is explained with reference to FIG. 2. FIG. 2 is a bird's-eye view of a top surface of the machine unit. The machine unit is generally divided into an atmosphere-side machine unit 232 and a vacuum-side machine unit 233. The atmosphere-side machine unit 232 is a part that performs transportation and the like of wafers to take out and house the wafers from and in a cassette under the atmospheric pressure. The vacuum-side machine unit 233 is a part that transports wafers under a pressure reduced from the atmospheric pressure, and performs processes in the process chambers. A load lock 211 that is a part that increases and reduces the pressure between the atmospheric pressure and vacuum with wafers contained therein is provided between the atmosphere-side machine unit 232 and the vacuum-side machine unit 233.

The atmosphere-side machine unit 232 includes load ports 201, 202, an aligner 234, an atmosphere robot 203, and a housing 204 that covers a movable area of the atmosphere robot 203. A cassette housing a process subject wafer is placed in the load ports 201, 202. The atmosphere robot 203 that has a hand that can hold wafers takes out a wafer housed in the cassette, and transport the wafer to the load lock 211, and otherwise take out a wafer from the load lock 211, and house the wafer in the cassette. The atmosphere robot 203 can expand and contract, move up and down, and rotate a robot arm, and furthermore can move inside the housing 204 horizontally. Also, the aligner 234 is a machine for aligning orientations of wafers. The atmosphere-side machine unit 232 is merely an example, and the device according to the present invention is not limited to a device having two load ports, but the number of load ports may be larger than or smaller than two. In addition, the device according to the present invention is not limited to a device having one atmosphere robot, but the device may have a plurality of atmosphere robots. In addition, the device according to the present invention is not limited to a device having one aligner, but the device may have a plurality of aligners, or may not have an aligner.

The vacuum-side machine unit 233 includes process chambers 205, 206, 207, 208, 209, 210, transport chambers 214, 215, 216, and buffer rooms 212, 213. The process chambers 205, 206, 207, 208, 209, 210 are portions that perform processes such as etching and deposition on wafers. The process chambers 205, 206, 207, 208, 209, 210 are connected to the transport chambers 214, 215, 216 respectively, through gate valves 222, 223, 226, 227, 230, 231. The gate valves 222, 223, 226, 227, 230, 231 have valves that open and close, and can partition spaces inside the process chambers 205, 206, 207, 208, 209, 210 and spaces inside the transport chambers 214, 215, 216, and connect the spaces.

The transport chambers 214, 215, 216 are provided with vacuum robots 217, 218, 219, respectively. The vacuum robots 217, 218, 219 are provided with hands that can hold wafers, and robot arms that can expand and contract, rotate, and move up and down to transport wafers to the load lock 211, the process chambers 205, 206, 207, 208, 209, 210, and the buffer rooms 212, 213.

The buffer rooms 212, 213 are connected between the transport chambers 214, 215, 216, and provided with mechanisms to hold wafers. With the vacuum robots 217, 218, 219 placing wafers in the buffer rooms 212, 213 and taking out wafers therefrom, wafers can be passed between the transport chambers 214, 215, 216. The buffer rooms 212, 213 are connected to the transport chambers 214, 215, 216 respectively, through gate valves 224, 225, 228, 229. The gate valves 224, 225, 228, 229 have valves that open and close, and can partition spaces inside the transport chambers 214, 215, 216 and spaces inside the buffer rooms 212, 213, and connect the spaces. The vacuum-side machine unit 233 is merely an example, and the device according to the present invention is not limited to a device having six process chambers, but the number of process chambers may be larger than or smaller than six. Also, it is explained that in the device according to the present embodiment, two process chambers are connected to a transport chamber, but the device according to the present invention is not limited to a device in which two process chambers are connected to a transport chamber, but the number of process chambers connected to a transport chamber may be one, or three or larger. In addition, the device according to the present invention is not limited to a device having three transport chambers, but the number of transport chambers may be larger than or smaller than three. Also, it is explained in the present embodiment that the device is provided with gate valves between transport chambers and buffer rooms, but there may not be gate valves.

The load lock 211 is connected to the atmosphere-side machine unit 232 and the vacuum-side machine unit 233 through gate valves 220, 221 respectively, and can increase and reduce the pressure between the atmospheric pressure and vacuum with wafers contained therein.

Figure 3:
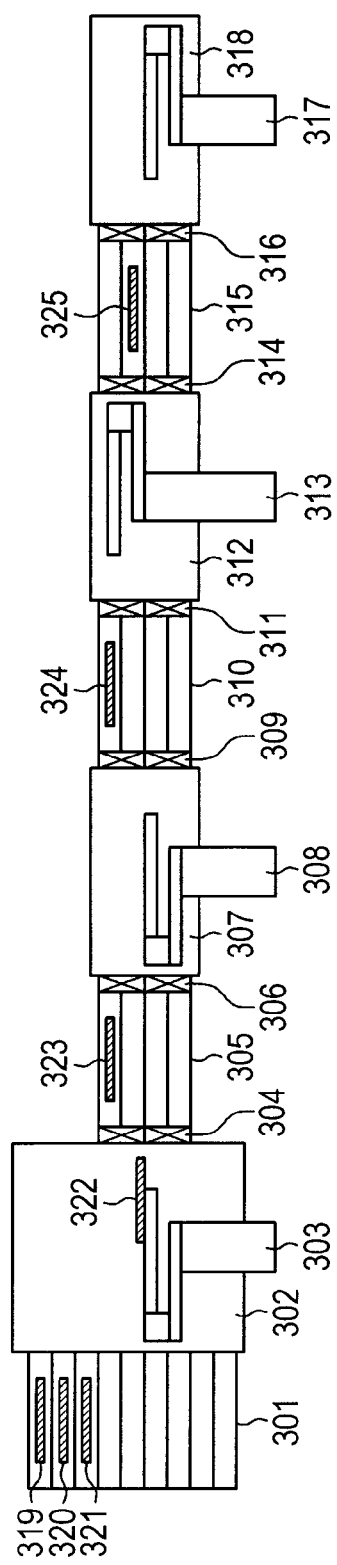
FIG. 3 is a figure for explaining a structure of holding wafers of the machine unit of the semiconductor process device.

Next, a structure of holding wafers is explained with reference to FIG. 3 that is a bird's-eye view of a side surface of a machine unit. Wafers can be held in a load lock 305, and buffer rooms 310, 315. The load lock 305 and the buffer rooms 310, 315 hold wafers in structures that can hold a plurality of wafers separately (hereinafter, holding steps). It is physically possible to place wafers on any holding step, but in a general operation, only unprocessed wafers are placed on certain holding steps, and only processed wafers are placed on other holding steps. This is because corrosive gases used for processes are adhered to the processed wafers, and may remain on the holding steps. When the unprocessed wafers contact the gases, the wafers may be degenerated to degrade the qualities thereof. Accordingly, for example, when there are four holding steps in a load lock as shown in FIG. 3, two holding steps are for unprocessed wafer, and the remaining two holding steps are for processed wafers.

The reference numeral 301 designates a cassette placed in a load port; 302 a housing that covers a movable area of an atmosphere robot; 303 the atmosphere robot; 307, 312 and 318 transport chambers; 308, 313 and 317 a vacuum robot; 304, 306, 309, 311, 314 and 316 gate valves; and 319, 320, 321, 322, 323, 324 and 325 wafers.

Next, an overall flow of an operation control system of the semiconductor process device according to the present invention is explained with reference to FIG. 4. It is assumed in the following explanation that, in the present invention, a linear tool handles only a process of a step that completes a process by performing a process in a process chamber, and once transportation of a wafer is started from an initial position, the transportation is performed under an operation condition that a process chamber where the process is planned cannot be changed.

A user can select a control mode of "manual" or "automatic" with a console display 401. When "automatic" is selected here, the user can further select whether to perform control responding to a process time that varies irregularly. Because a calculation process for control differs depending on the selected control mode and whether to respond to process time irregularity, a control mode setting unit 402 switches the calculation process for control depending on the designated control mode and whether to respond to irregularity. For example, when "manual" is designated as the control mode, manual transport destination setting 403 is executed. On the other hand, when "automatic" is designated as the control mode, and not to respond to process time irregularity is designated, transport destination deciding calculation without responding to process time irregularity 404 is executed. Also, on the other hand, when "automatic" is designated as the control mode, and to respond to process time irregularity is designated, transport destination deciding calculation responding to process time irregularity 405 is executed.

Each one of the arithmetic operation processes 403, 404, 405 is for deciding a transport destination process chamber for a wafer to be charged, and outputting transport destination information 406. In operation command calculation 407, an operation command 409 is computed based on the transport destination information 406 and device state information 408, and a machine unit 410 performs an operation based on the operation command 409. The state inside the device changes by performing the operation, and the device state information 408 is updated. Again, in the operation command calculation 407, the operation command 409 is computed based on the transport destination information 406 and the device state information 408, and the machine unit 410 performs a next operation.

Also, the arithmetic operation processes 404, 405 of deciding the transport destination process chamber automatically are executed every time a transport destination for a new process subject is decided, and the transport destination information 406 is updated. For example, when an atmosphere robot ends transportation of a wafer, and an operation on a new wafer can now be performed, a transport destination for the new wafer is calculated.

Because the present invention relates to an efficient control method when the control mode is "automatic" and to respond to process time irregularity is designated, the control method in such a case is explained hereinafter. Accordingly, the transport destination deciding calculation means the transport destination deciding calculation responding to process time irregularity 405 hereinafter.

Figure 4:
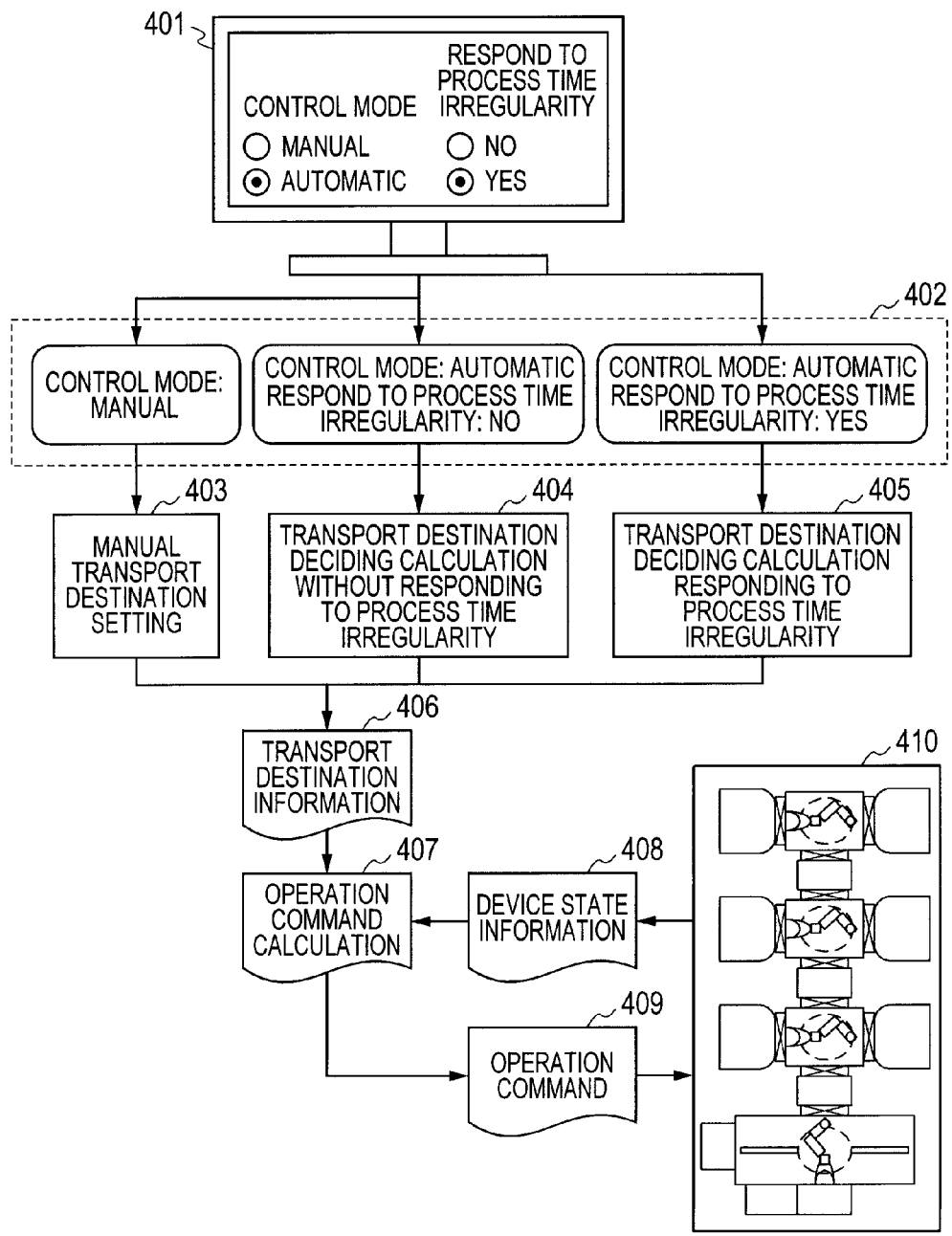
FIG. 4 is a flowchart for explaining an overall flow of an operation control system of the semiconductor process device.
Figure 5:
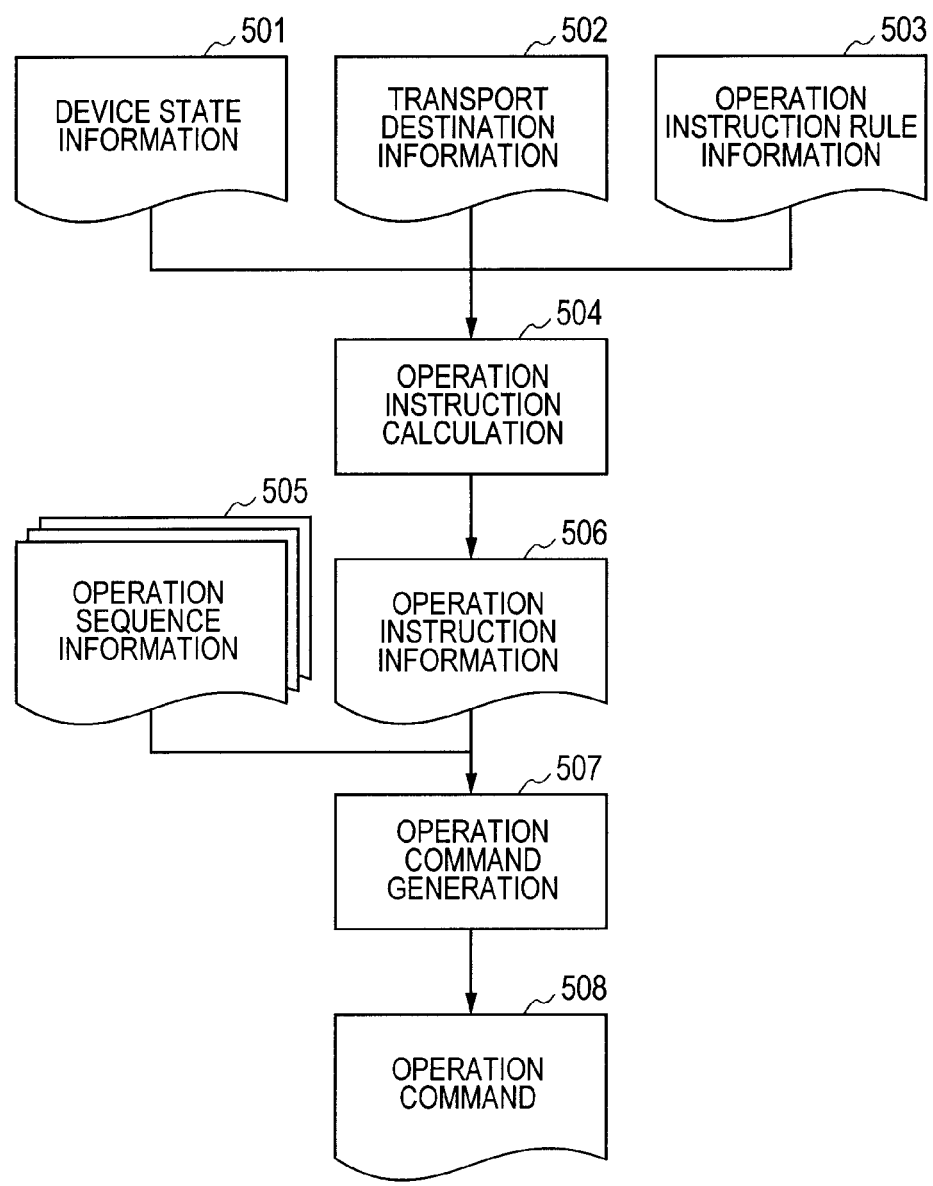
FIG. 5 is a figure for explaining a process of operation instruction calculation, and input and output information.

First, the operation command calculation 407 shown in FIG. 4 is explained in detail with reference to FIG. 5. FIG. 5 is a figure that shows a relationship between a process of the operation command calculation 407, and input and output information in detail. The operation command calculation 407 is configured with two arithmetic operation processes of an operation instruction calculation 504 and an operation command generation 507.

In the operation instruction calculation 504, device state information 501, transport destination information 502 and operation instruction rule information 503 are input, and operation instruction information 506 is output. The device state information 501 is exemplified in FIG. 13, and shows the state of each portion, a number of a wafer that is present there, and the state of a process. For example, data "portion: load lock 221_step 1, state: vacuum, wafer number: W11, wafer state: unprocessed" represents the state of a first holding step of the load lock 221, and means that the load lock is in vacuum, a wafer with a wafer number W11 is held, and W11 is an unprocessed wafer. The transport destination information 502 is exemplified in FIG. 16, and shows a transport destination process chamber for each wafer. The operation instruction rule information 503 is exemplified in FIG. 18, and describes an operation instruction and a condition for following the operation instruction. For example, an operation instruction "transport from the load lock 211 to the buffer room 212" means that the instruction is followed when conditions "there is an unprocessed wafer whose transport destination is not the process chambers 205 and 206 in the load lock 211 which is in vacuum", "there is an available holding step in the buffer room 212" and "at least one hand of the vacuum robot 217 is standing by" are met. The operation instruction information 506 is exemplified in FIG. 17, and contains an operation instruction of transportation and a wafer number of a transport subject. In the operation instruction calculation 504, the device state information 501 and the transport destination information 502 are referred to, an operation instruction whose operation instruction conditions in the operation instruction rule information 503 are all met is extracted, and the operation instruction is output as the operation instruction information 506.

In the operation command generation 507, the operation instruction information 506 and operation sequence information 505 are input, an operation command 508 is output, and the operation command 508 is transmitted to a machine unit. The operation sequence information 505 is exemplified in FIG. 19. The operation sequence information 505 describes, about an operation instruction, specific operation contents of each portion such as an operation of an atmosphere robot and a vacuum robot, an open/close operation of gate valves between load locks, buffer rooms and process chambers, an operation of a pump that performs vacuum drawing of the load locks, and means that operations are executed starting from ones with smaller numbers described in operation order columns. The operation sequence information 505 is defined for each operation instruction.

In the operation command generation 507, operation sequence data about an operation instruction is extracted from the operation sequence information 505 about the operation instruction in the operation instruction information 506, and the data is transmitted as an operation command to the machine unit starting from ones with smaller operation order numbers.

Figure 6:
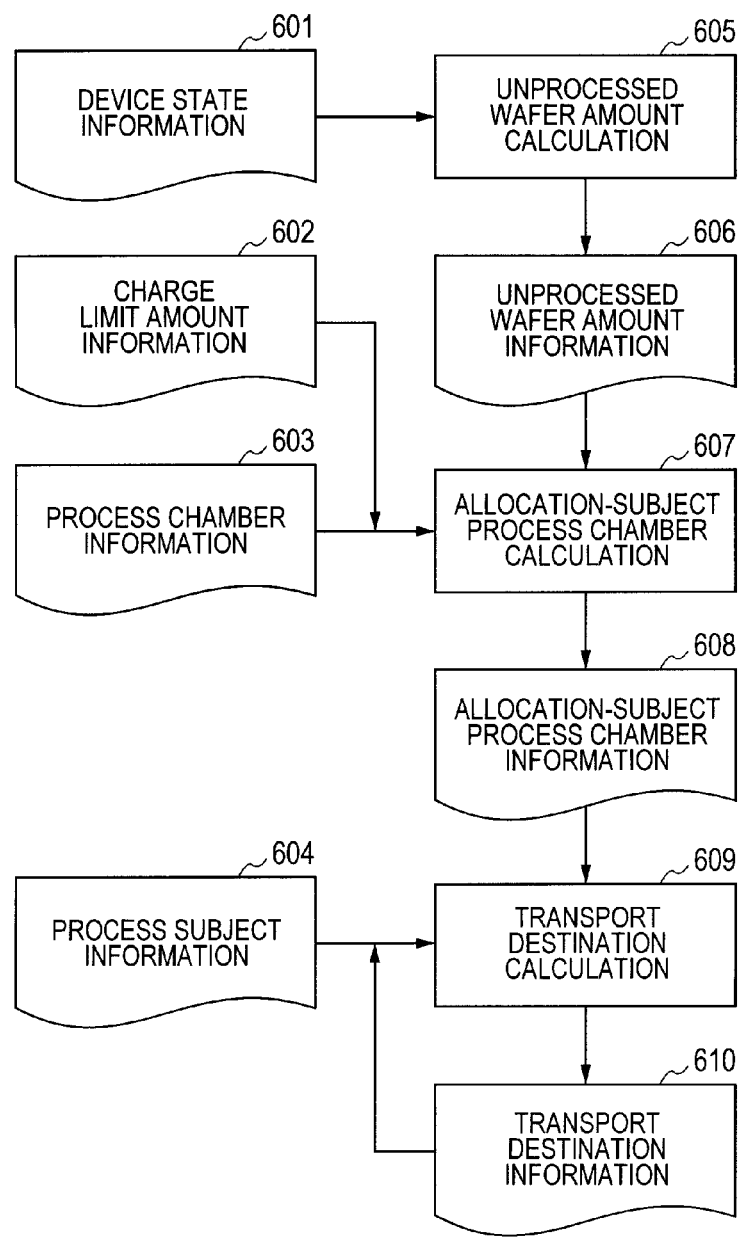
FIG. 6 is a figure for explaining a process of transport destination deciding calculation, and input and output information.

Next, an embodiment of the transport destination deciding calculation 405 shown in FIG. 4 is explained in detail with reference to FIG. 6. FIG. 6 is a figure showing a relationship between a process of the transport destination deciding calculation 405, and input and output information in detail. The transport destination deciding calculation 405 is configured with three arithmetic operation processes of unprocessed wafer amount calculation 605, allocation-subject process chamber calculation 607, and transport destination calculation 609.

In the unprocessed wafer amount calculation 605, device state information 601 is input, and unprocessed wafer amount information 606 is output. The unprocessed wafer amount information 606 is exemplified in FIG. 20, and shows, for each process chamber, the number of unprocessed wafers whose transport destinations are the process chamber. Here, an unprocessed wafer is one on which a process is not completely ended in a process chamber. In the present embodiment, a state of a wafer is managed by identifying it with three states "unprocessed", "in process", and "process completed", and in this case, an unprocessed wafer means one the state of which is "unprocessed" or "in process". Details of a process of the unprocessed wafer amount calculation 605 are described below.

In the allocation-subject process chamber calculation 607, charge limit amount information 602, process chamber information 603 and the unprocessed wafer amount information 606 are input, and allocation-subject process chamber information 608 is output. The charge limit amount information 602 is exemplified in FIG. 22, and means, for each process chamber, an upper limit of the number of wafers in process in the process chamber, and unprocessed wafers that are transported to the process chamber. The process chamber information 603 is exemplified in FIG. 15, and shows an operation status of each process chamber. The status of "active" means that a process can be performed, and the status of "inactive" means that a process cannot be performed. The allocation-subject process chamber information 608 is exemplified in FIG. 21, and lists up process chambers that are candidates in allocating a transport destination when calculating a transport destination of a wafer. Details of a process of the allocation-subject process chamber calculation 607 are described below.

In the transport destination calculation 609, process subject information 604, transport destination information 610 and the allocation-subject process chamber information 608 are input, and the transport destination information 610 is updated. The process subject information 604 is exemplified in FIG. 14, and describes a wafer number that identifies a process subject wafer. Details of a process of the transport destination calculation 609 are described below.

Figure 7:
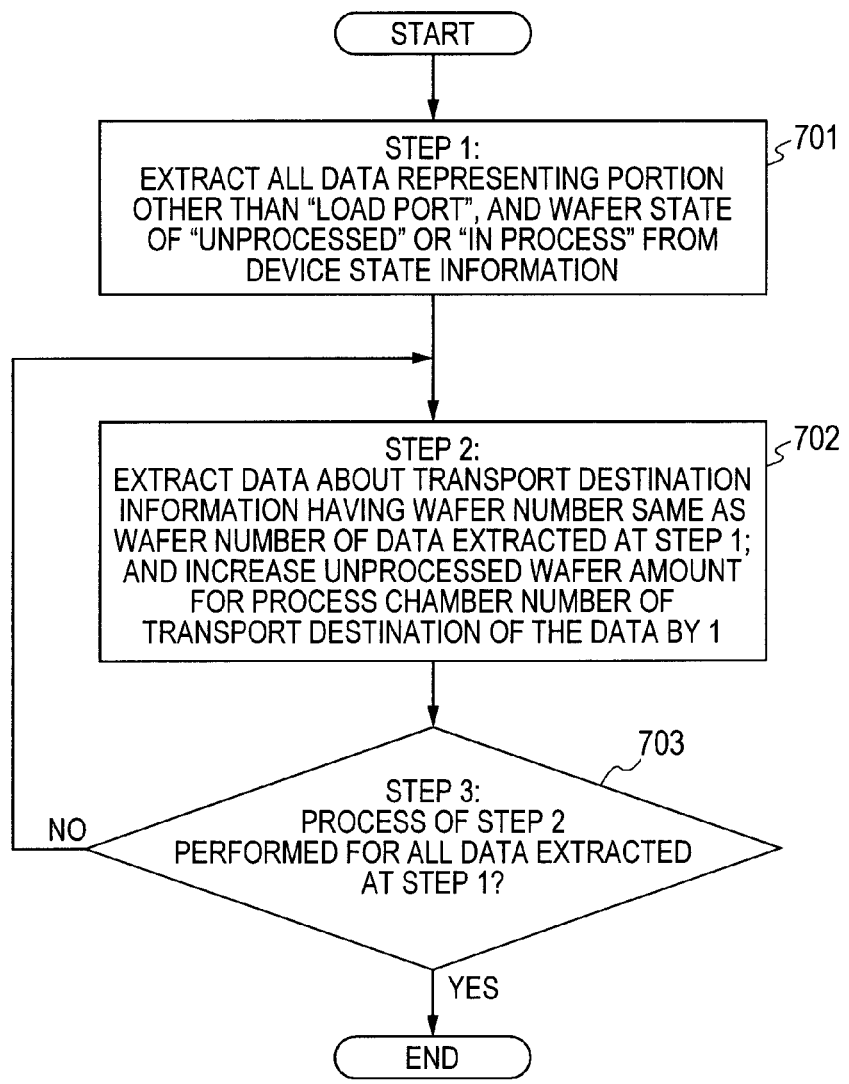
FIG. 7 is a figure for explaining details of a process of unprocessed wafer amount calculation.

Next, details of the process of the unprocessed wafer amount calculation 605 shown in FIG. 6 are explained with reference to a flowchart of FIG. 7. In the unprocessed wafer amount calculation 605, for each process chamber, the number of unprocessed wafers whose transport destinations are the process chamber is computed. First, data about unprocessed wafer amount information is cleared. Next, at a process step 701, all the data representing portions other than the "load ports", and the state of a wafer of "unprocessed" or "in process" is extracted from device state information. Then, at a process step 702, a piece of the data extracted at the process step 701 is selected, data about transport destination information having a wafer number same as the wafer number of the piece of the data is extracted, a number of a process chamber that is a transport destination of the data about the transport destination information is acquired, and the number of unprocessed wafers with the process chamber numbers in the unprocessed wafer amount information is increased by one. Next, at a process step 703, it is checked whether the process step 702 has been performed for all the data extracted at the process step 701, and if the process step 702 has been performed for all the data, the unprocessed wafer amount calculation 605 ends. On the other hand, if the process step 702 has not been performed for all the data, the procedure returns to the process step 702, and the process step 702 and the subsequent processes are repeated.

Figure 8:
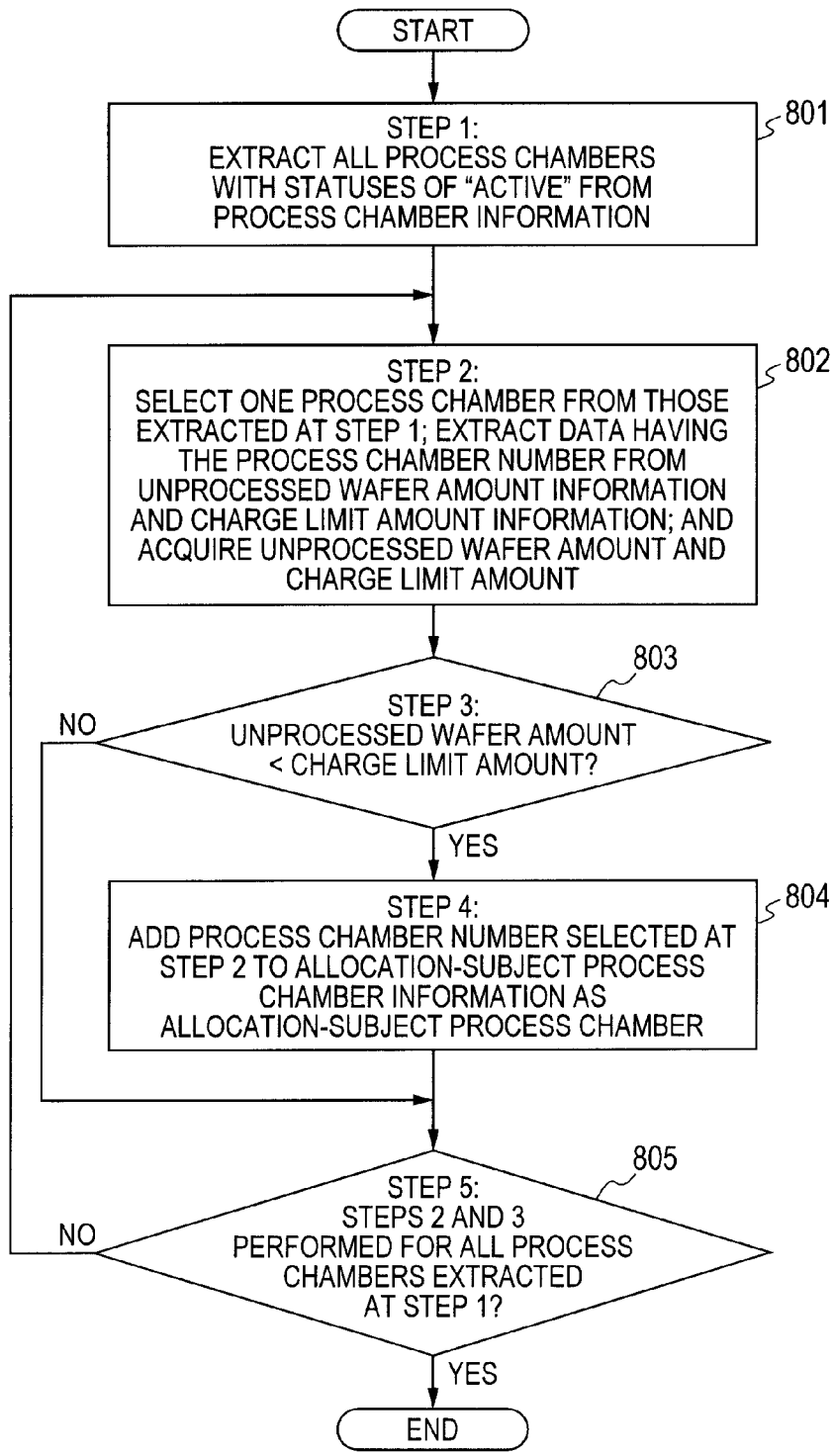
FIG. 8 is a figure for explaining details of a process of allocation-subject process chamber calculation.

Next, details of the process of the allocation-subject process chamber calculation 607 shown in FIG. 6 are explained with reference to a flowchart of FIG. 8. In the allocation-subject process chamber calculation 607, candidates of an allocated process chamber are decided when deciding a transport destination of a wafer. First, allocation-subject process chamber information is cleared. Next, at a process step 801, all the process chambers with the statuses of "active" are extracted from process chamber information. Next, at a process step 802, a piece of the data in the process chamber information extracted in the process step 801 is selected. Data having a process chamber number same as a process chamber number of the selected piece of the data is extracted from unprocessed wafer amount information, and an unprocessed wafer amount of the data is acquired. Also, data having a process chamber number same as a process chamber number of the selected piece of the data is extracted from charge limit amount information, and a charge limit amount of the data is acquired. Next, at a process step 803, the unprocessed wafer amount and the charge limit amount acquired at the process step 802 are compared with each other. When the unprocessed wafer amount is smaller than the charge limit amount, the procedure proceeds to a process step 804, and when the unprocessed wafer amount is equal to or larger than the charge limit amount, the procedure proceeds to a process step 805. At a process step 804, to make the process chamber selected at the process step 802 an allocation-subject process chamber, the process chamber number is added to the allocation-subject process chamber information. Next, at the process step 805, it is checked whether the process steps 802 and 803 have been performed for all the process chambers extracted at the process step 801, and if the process chamber steps 802 and 803 have been performed for all the process chambers, the allocation-subject process chamber calculation 607 ends. On the other hand, if the process chamber steps 802 and 803 have not been performed for all the process chambers, the procedure returns to the process step 802, and the process step 802 and the subsequent processes are repeated.

Figure 9:
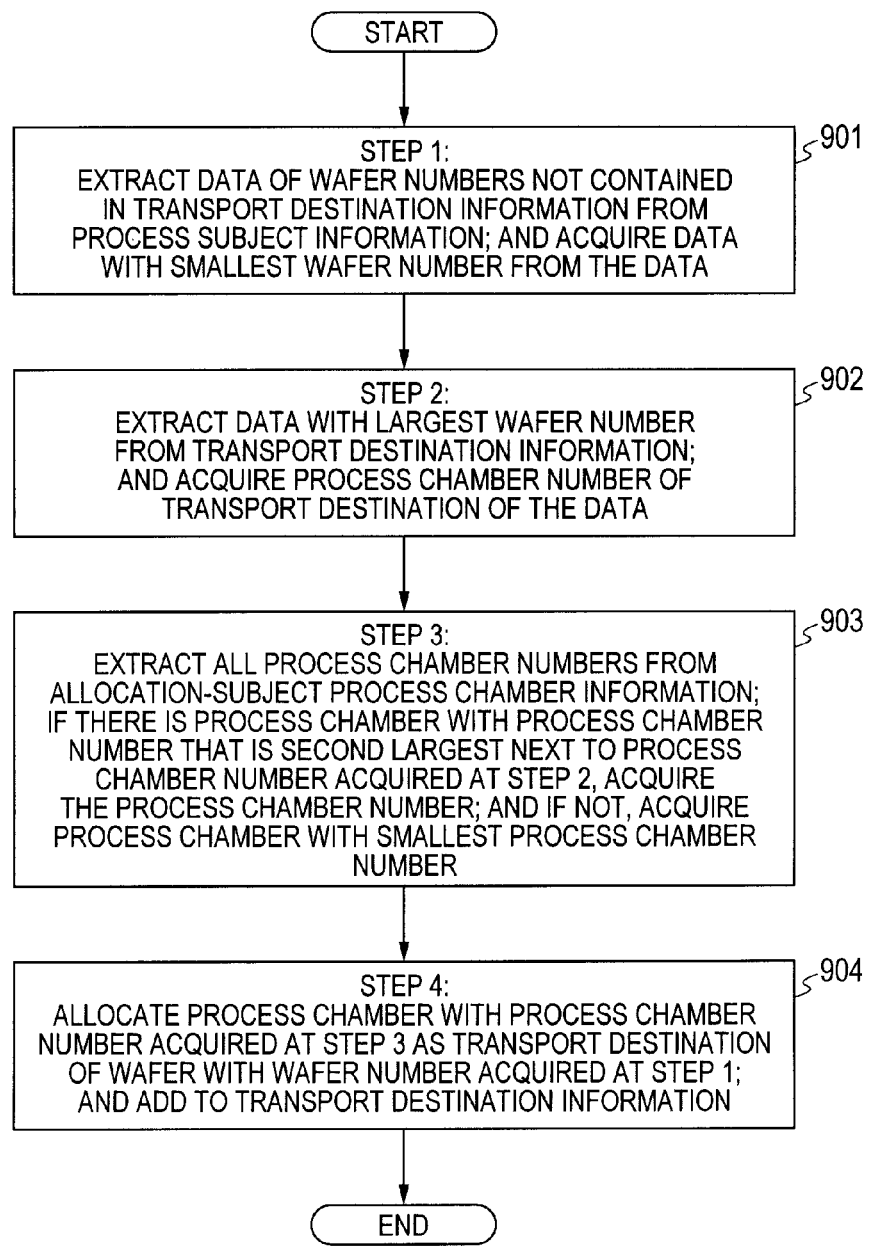
FIG. 9 is a figure for explaining details of a process of transport destination calculation.

Next, details of the process of the allocated transport destination calculation 609 shown in FIG. 6 are explained with reference to a flowchart of FIG. 9. In the transport destination calculation 609, a transport destination process chamber of a wafer to be charged in the device is decided. First, at a process step 901, a wafer number of a wafer to be charged in the device is acquired. The specific process is that data about wafer numbers not contained in transport destination information are extracted from process subject information, data about a wafer with the smallest wafer number is acquired therefrom, and the wafer is made a wafer to be charged in the device. Next, at a process step 902, data about a wafer with the largest wafer number is extracted from the transport destination information, and a transport destination process chamber of the data is acquired. Then, next at a process step 903, all the process chamber numbers in allocation-subject process chamber information are extracted, and if there is a process chamber number larger than the process chamber number acquired at the process step 902, a process chamber with the smallest process chamber number among the process chamber numbers larger than the process chamber number acquired at the process step 902 is made a transport destination process chamber. If there is not a process chamber number larger than the process chamber number acquired at the process step 902, a process chamber with the smallest process chamber number among all the process chamber numbers in the allocation-subject process chamber information is made a transport destination process chamber. Lastly, at a process step 904, the transport destination process chamber acquired at the process step 903 is allocated as a transport destination process chamber of the wafer acquired at the process step 901, and is added to the transport destination information. The algorithm of deciding the transport destination explained in the present embodiment is merely an example, and the present invention is not limited to this algorithm. Any algorithm can be used as far as a transport destination of a wafer is calculated by inputting the allocation-subject process chamber information calculated based on unprocessed wafer amount information.

Here, the device state information 601 and the process chamber information 603 explained in FIG. 6 are information obtained by monitoring a machine unit, and are kept being updated, and the process subject information 604 is downloaded from a host computer when a cassette containing a process subject wafer arrives at a load port. On the other hand, the charge limit amount information 602 is calculated in advance at the time the structure of the machine unit of the device is decided. In the following, a method of calculating the charge limit amount information 602 is explained.

Figure 10:
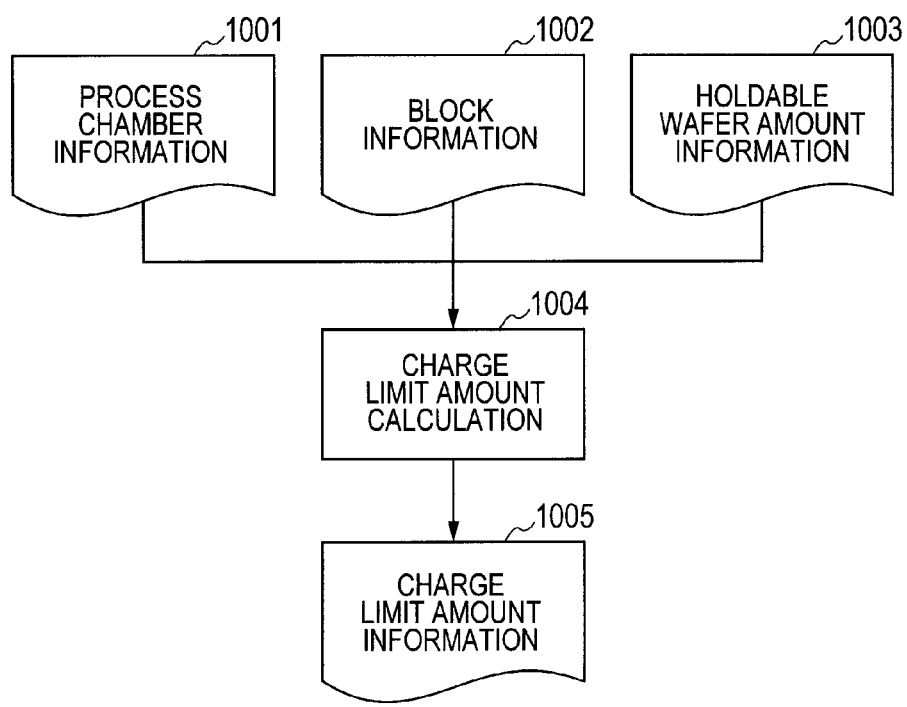
FIG. 10 is a figure for explaining a process of charge limit amount calculation, and input and output information.

FIG. 10 is a figure that explains a relation between a process of charge limit amount calculation, and input and output information. In charge limit amount calculation 1004, process chamber information 1001, block information 1002 and holdable wafer amount information 1003 are input, and charge limit amount information 1005 is output.

Figure 25:
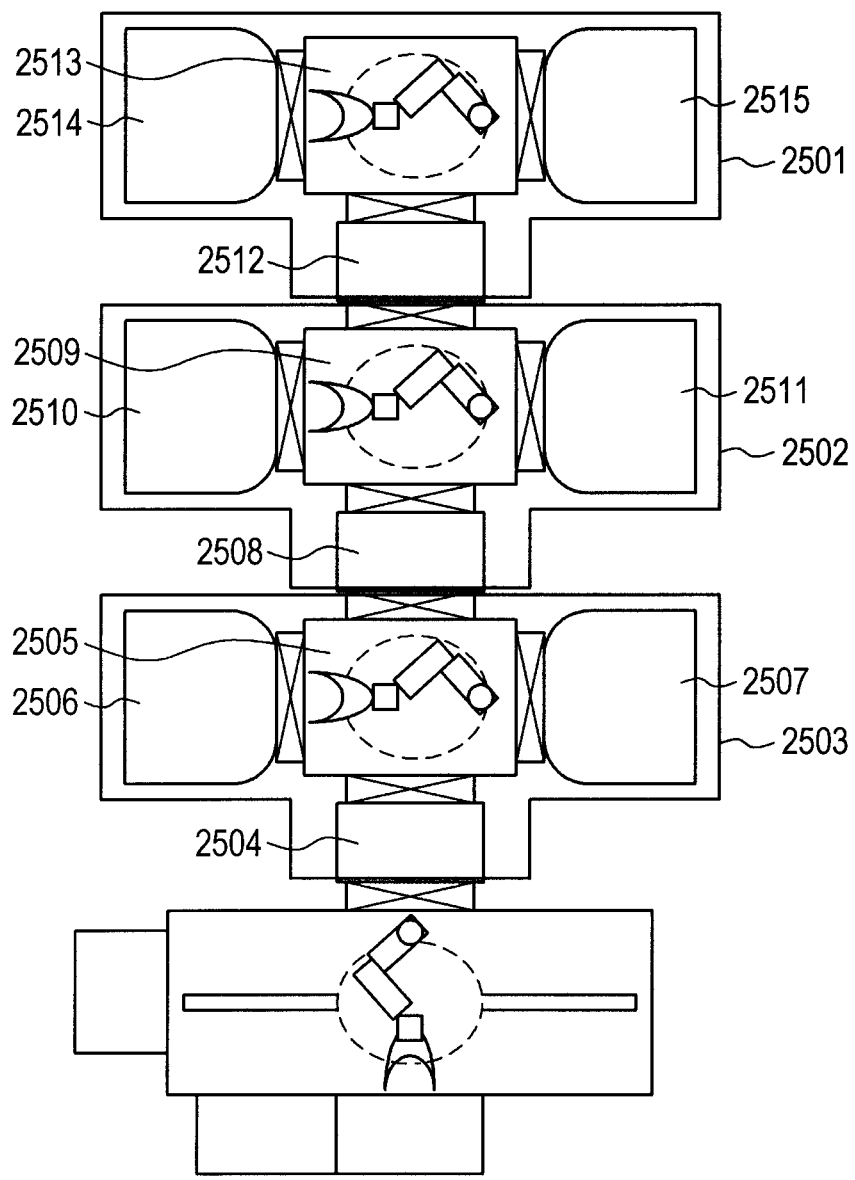
FIG. 25 is a figure that shows a relationship between the machine unit and a block of the semiconductor process device.

Here, a block is explained with reference to FIG. 25. A block is a unit that segments several portions of a vacuum-side machine unit. Portions configuring a block are a transport chamber, all the process chambers connected to the transport chamber, and a load lock connected to the transport chamber or a buffer room connected to the transport chamber. When a load lock is connected to the transport chamber, the load lock is included as a portion configuring the block, but a buffer room connected to the transport chamber is not included. An example is a block 2503 of FIG. 25. A load lock 2504 is connected to a transport chamber 2505, and a buffer room 2508 is also connected thereto. In this case, portions configuring the block 2503 are the transport chamber 2505, the load lock 2504, and process chambers 2506, 2507. Also, when two buffer rooms are connected to a transport chamber, a buffer room on a side closer to a load lock is included as a portion configuring a block including the transport chamber, and the other buffer room is not included in the block. An example is a block 2502 of FIG. 25. The buffer room 2508, and a buffer room 2512 are connected to a transport chamber 2509. In this case, the buffer room 2508 on a side closer to the load lock 2504 is included in a block including the transport chamber 2509, and the buffer room 2512 on a side far from the load lock 2504 is not included. Accordingly, portions configuring the block 2502 are the transport chamber 2509, the buffer room 2508, and process chambers 2510, 2511. Likewise, a block 2501 is configured with a transport chamber 2513, the buffer room 2512 and process chambers 2514, 2515. The block is defined according to the above rules.

As explained above, the block information 1002 is information as exemplified in FIG. 24, and shows correspondence of each block and portions configuring the block. Also, the holdable wafer amount information 1003 is information as shown in FIG. 23, and shows the number of wafers that can be held in each block. The wafers can be held in a load lock and a buffer room, and the holdable wafer amount information 1003 is the number of wafers that can be held in the load lock and the buffer room configuring the block. Also, the holdable wafer amount means the number of unprocessed wafers that can be held, and for example, in a case that there are four holding steps in a buffer room, when two holding steps are for holding unprocessed wafers and the other two holding steps are for holding processed wafers, the holdable wafer amount is two.

Figure 11:
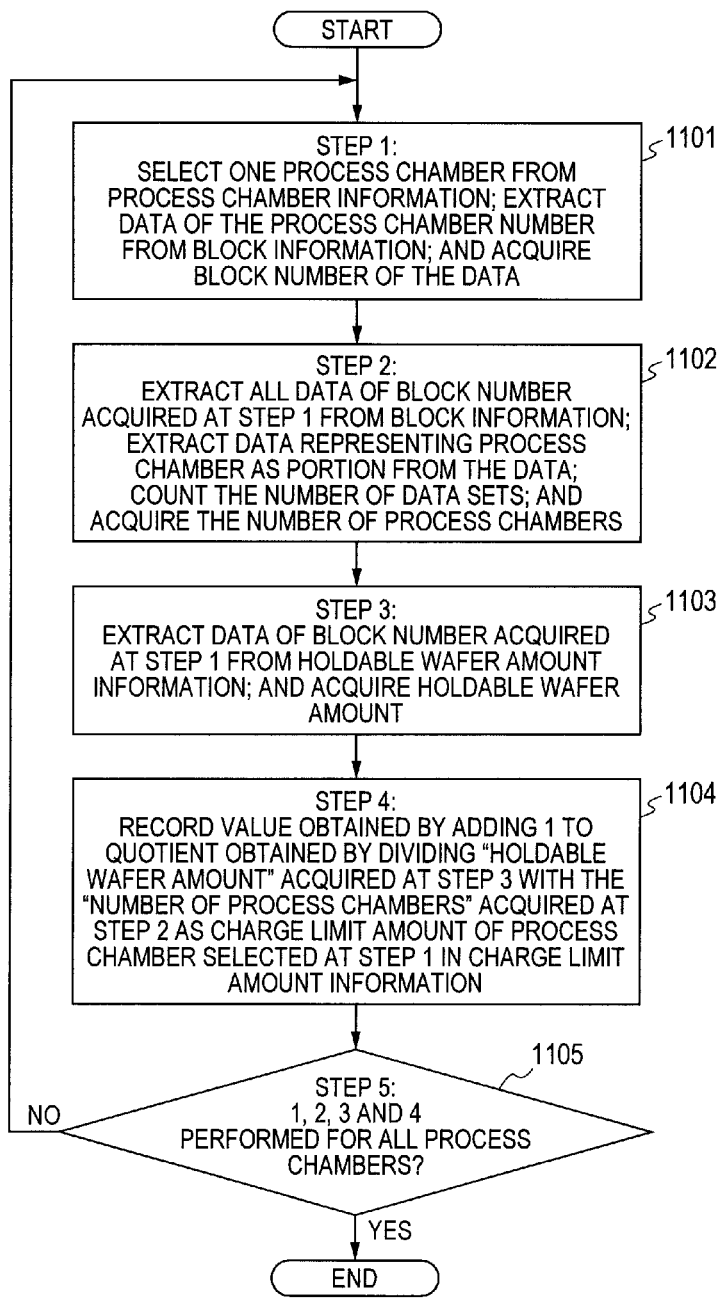
FIG. 11 is a figure for explaining details of a process of charge limit amount calculation.

Next, details of the process of the charge limit amount calculation are explained with reference to FIG. 11. First, at a process step 1101, a process chamber is selected from process chamber information, data about the process chamber is extracted from block information, and a block number of the data is acquired. Next, at a process step 1102, all the data having the block number acquired at the process step 1101 is extracted from the block information, and the number of data sets representing process chambers as portions are counted. That is, the number of process chambers configuring the block is counted. Next, at a process step 1103, data having the block number acquired at the process step 1101 is extracted from holdable wafer amount information, and the holdable wafer amount of the data is acquired. Next, at a process step 1104, a quotient is obtained by dividing the holdable wafer amount acquired at the process step 1103 with the number of process chambers acquired at the process chamber step 1102, and the value obtained by adding one to the quotient is recorded in charge limit amount information as the charge limit amount of the process chamber selected at the process step 1101. Lastly, at a process step 1105, it is checked whether the processes of the process chamber steps 1102, 1103 and 1104 have been performed for all the process chambers contained in the process chamber information. If the processes have been performed for all the process chambers contained in the process chamber information, the process ends, and if the processes have not been performed for all the process chambers contained in the process chamber information, the procedure returns to the process chamber step 1101, and the process chamber step 1101 and the subsequent processes are repeated.

Next, an embodiment of the transport destination deciding calculation 405 shown in FIG. 4 is explained with reference to FIG. 26. The transport destination deciding calculation 405 is configured with three arithmetic operation processes of reservation information calculation 2601, allocation-subject process chamber information calculation 2603, and transport destination calculation 2605.

In the reservation information calculation 2601, transport destination information 2606, device state information 2607 and transport path information 2608 are input, and reservation information 2062 is output. The transport destination information 2606 is exemplified in FIG. 16 as explained above. Also, the device state information 2607 is exemplified in FIG. 13 as explained above. The transport path information 2608 is exemplified in FIG. 29, and lists up, for each process chamber, buffer rooms and load locks on a transport path of a wafer when the process chamber has become a transport destination. The reservation information 2062 is exemplified in FIG. 30, and stores therein reservation status of each step, that is, each holding mechanism, provided in a room such as a load lock and a buffer room provided with a mechanism to a wafer. Here, the reservation state of each holding mechanism is indicated with either of "blank" and "wafer number". "Blank" indicates that the holding mechanism is not reserved, and "wafer number" indicates the holding mechanism is reserved for a wafer with the wafer number. Details of a process of the reservation information calculation 2601 are described below.

In the allocation-subject process chamber calculation 2603, the reservation information 2602 and process chamber information 2609 are input, and allocation-subject process chamber information 2604 is output. The allocation-subject process chamber information 2604 is exemplified in FIG. 21, and lists up process chambers to be candidates of a transport destination when calculating a transport destination of a wafer. Details of a process of the allocation-subject process chamber calculation 2603 are described below.

In the transport destination calculation 2605, process subject information 2610, the transport destination information 2606 and the allocation-subject process chamber information 2604 are input, and the transport destination information 2606 is updated. The process subject information 2610 is exemplified in FIG. 14, and describes a wafer number that identifies a process subject wafer. Details of a process of the transport destination calculation 2605 are similar to the process of the flowchart in FIG. 9 explained above.

Figure 26:
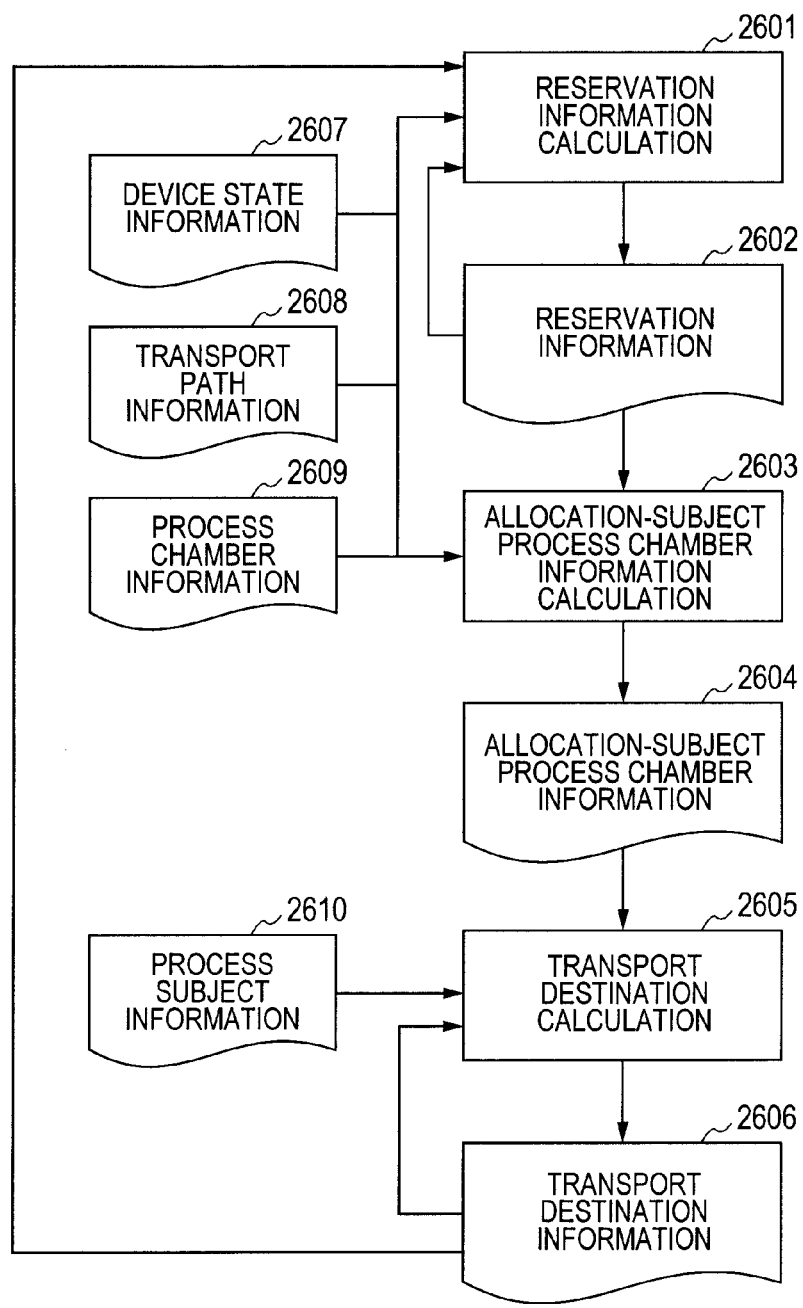
FIG. 26 is a figure for explaining a process of transport destination deciding calculation, and input and output information.
Figure 27:
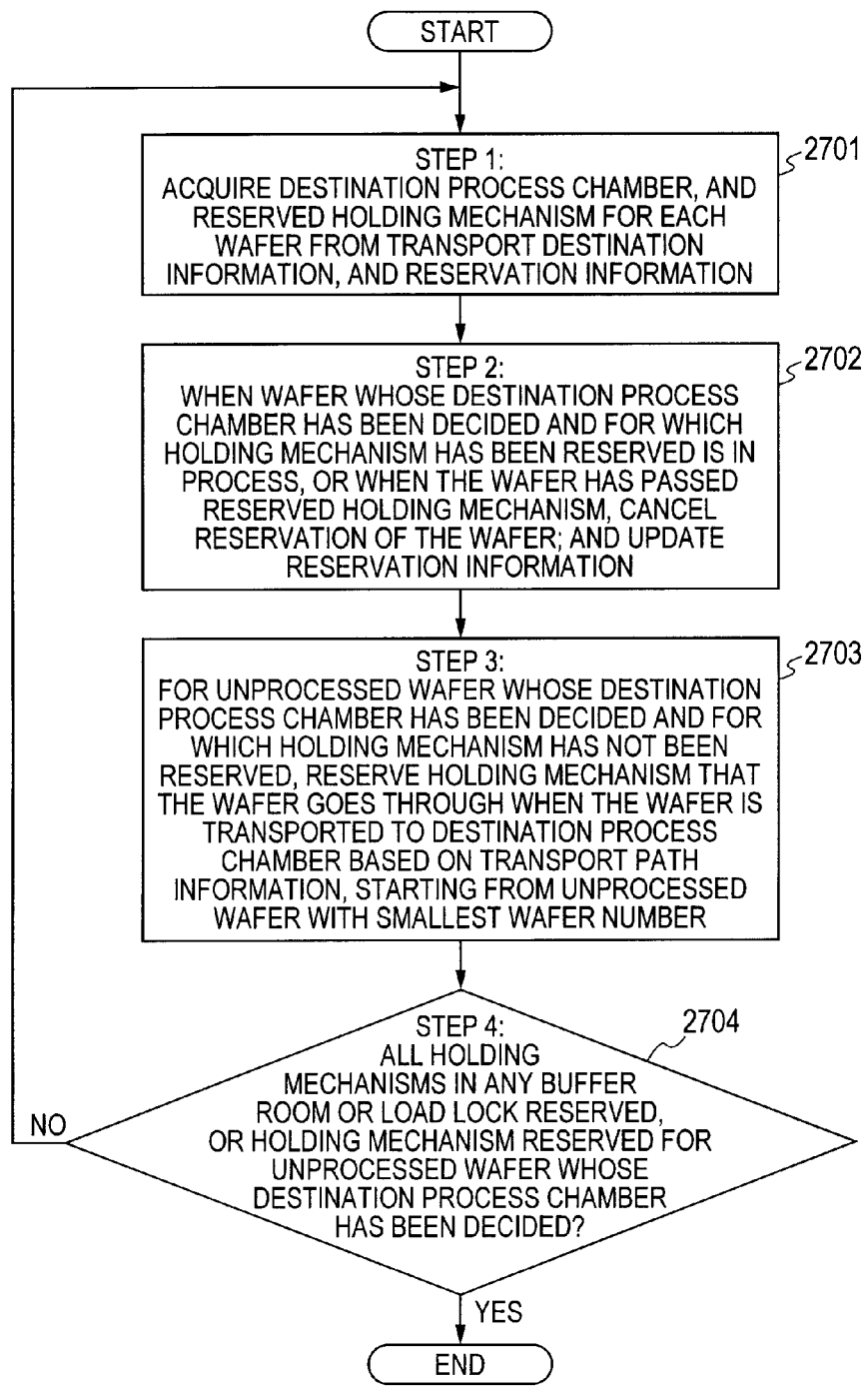
FIG. 27 is a figure for explaining details of a process of reservation information calculation.

Next, details of the process of the reservation information calculation 2601 shown in FIG. 26 are explained with reference to a flowchart of FIG. 27. In the reservation information calculation 2601, for each wafer, a transport destination process chamber and a holding mechanism that the wafer goes through when the wafer is transported to the process chamber are reserved, or the reservations are cancelled. First, at a process step 2701, for each wafer, information of a transport destination process chamber, and a holding mechanism that the wafer goes through when the wafer is transported to the process chamber is acquired. Next, at a process step 2702, for each wafer whose transport destination has been decided and for which a holding mechanism has been reserved, when the wafer is in process or the wafer has passed through the holding mechanism, the reservation of the holding mechanism is cancelled. Here, that the wafer has passed through the holding mechanism means that, after the wafer has once been transported to the holding mechanism, the wafer has been transported out of the holding mechanism by a transport robot to be transported to another holding mechanism. Next, at a process step 2703, for a wafer with the smallest wafer number among unprocessed wafers whose transport destinations have been decided, and for which holding mechanisms have not been reserved, all the holding mechanisms that the wafer goes through when the wafer is transported to a process chamber are reserved. Here, when a holding mechanism is reserved, all the holding mechanisms do not have to be reserved. A holding mechanism provided in a buffer room that is closer to a load lock among buffer rooms on a transport path connected to a transport chamber that transports to a transport destination process chamber or, when there is not a buffer room on a transport path, only a holding mechanism provided in a load lock may be reserved. At a process step 2704, it is checked whether all the holding mechanisms are reserved or whether there is a wafer for which a holding mechanism is yet to be reserved. If either one of the above conditions is met, the reservation information calculation 2601 ends, and if neither of the conditions is met, the process step 2701 is executed again.

Figure 28:
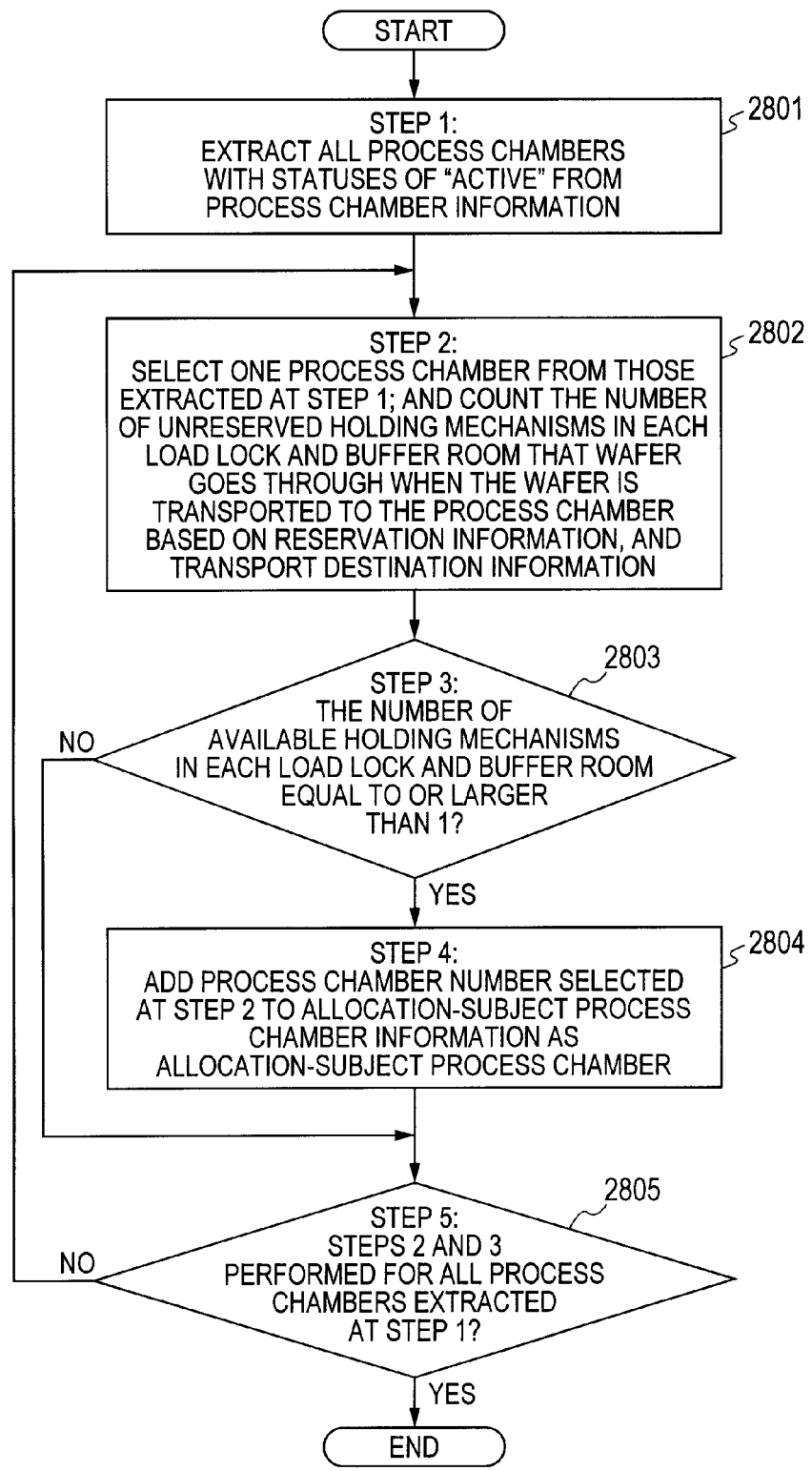
FIG. 28 is a figure for explaining details of a process of allocation-subject process chamber calculation.

Next, details of the process of the allocation-subject process chamber calculation 2603 shown in FIG. 26 are explained with reference to a flowchart of FIG. 28. In the allocation-subject process chamber calculation 2603, a process chamber to which a wafer can be transported is extracted. First, at a process step 2801, an active process chamber is extracted. At a process step 2802, for each active process chamber, availability information of a holding mechanism of each load lock and buffer room that a wafer goes through when the wafer is transported to the process chamber is acquired. At a process step 2803, it is judged, for each process chamber, that the process chamber is not an allocation subject when the number of available holding mechanisms provided in at least either one of a load lock and a buffer room that a wafer goes through when the wafer is transported to the process chamber is one or less, and the process chamber is an allocation-subject process chamber at a process step 2804 when there is certainly more than one holding mechanisms provided in a load lock and a buffer room that a wafer goes through when the wafer is transported to the process chamber. At a process step 2805, it is checked whether the process has been executed for all the active process chambers.

Here, the device state information 2607 and the process chamber information 2609 explained in FIG. 26 are information obtained by monitoring a machine unit, and are kept being updated. Also, the process subject information 2610 is downloaded from a host computer when a cassette containing a process subject wafer arrives at a load port.

Figure 12:
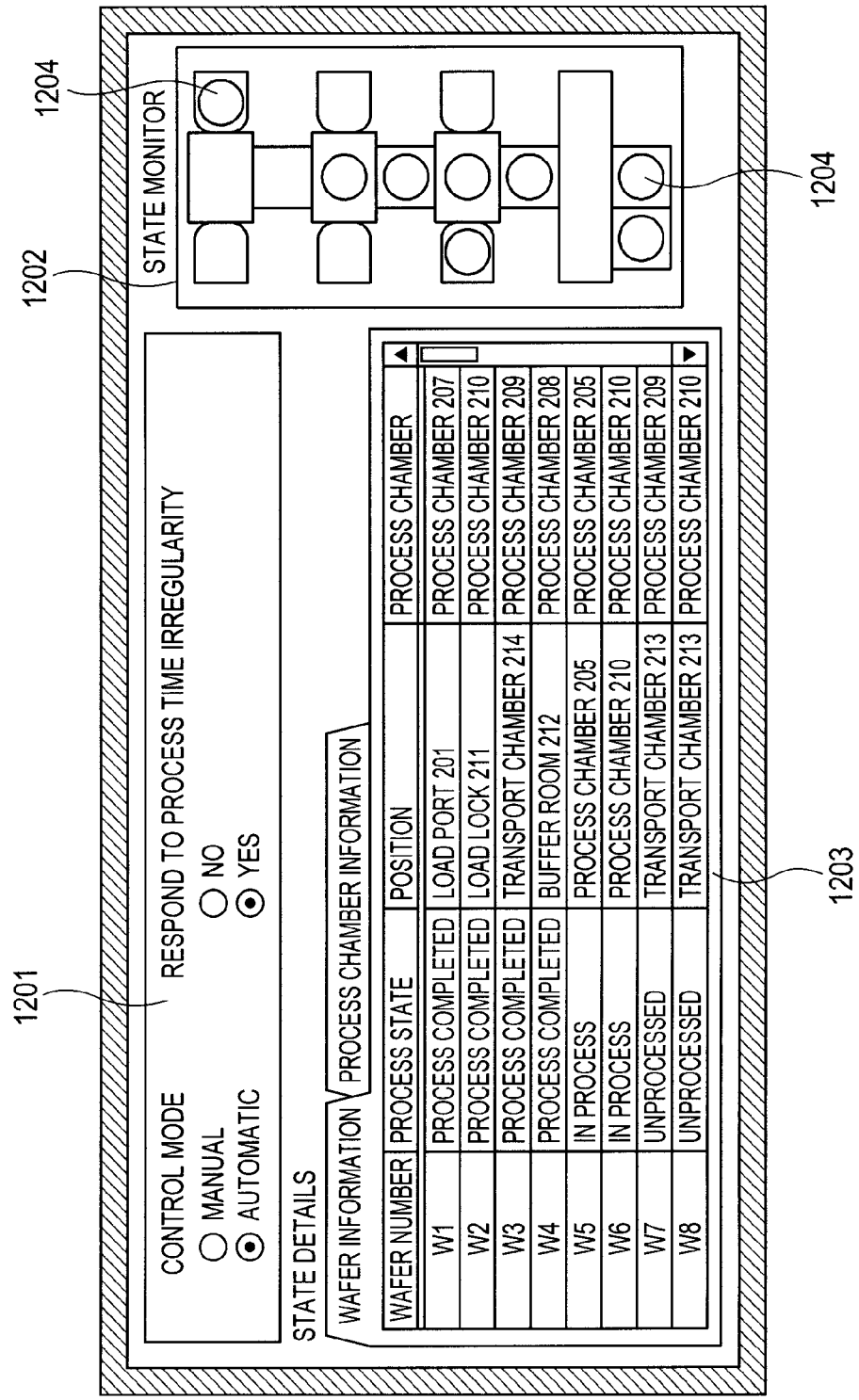
FIG. 12 is a figure that shows an example of a display of a console terminal.

Lastly, a display of the console terminal 103 shown in FIG. 1 is explained with reference to FIG. 12. The console terminal 103 is provided with an input unit such as a keyboard, a mouse, and a touch pen, and an output unit such as a display. The display includes an area 1201 in which a control method is selected, an area 1202 that displays a summary of a device state, and an area 1203 that displays detailed data about the device state. In the area 1201 in which a control method is selected, a control method of either "manual" or "automatic" can be selected. Furthermore, when "automatic" is selected as the control method, whether to respond to process time irregularity can be selected. The area 1202 that displays a summary of a device state displays visually the device and a position of a wafer so that it is possible to grasp easily where the wafer is. When the wafer moves, a display position of the wafer changes accordingly. Circles in the area 1202 in the figure represent wafers 1204. Also, the area 1203 that displays detailed data about the device state displays details of a state of a wafer in the device, and details of a state of a process chamber and a transport mechanism.

What is claimed is:

1. A vacuum process device, the vacuum process device comprising:
   a load lock that takes in a work piece placed on an atmosphere-side to a vacuum-side;
   a plurality of process chambers that are provided on the vacuum-side, and perform a predetermined process on the work piece;
   a plurality of transport mechanism units provided with a vacuum robot that performs receiving and passing of the work piece;
   a plurality of transport buffer units that perform relay-transporting of the work piece by interconnecting the transport mechanism units;

a holding mechanism unit that is provided in the load lock and the transport buffer unit, and holds a plurality of the work pieces; and a control unit that controls the receiving and passing, and the relay-transporting of the work piece, wherein the control unit holds device state information that shows operation states of the process chambers, the transport mechanism units, the transport buffer units, and the holding mechanism unit, and presence and absence, and a process state of the work piece; computes based on the device state information, for each of the process chambers, the number of work pieces that are in process or are being transported to the process chamber where a process on the work pieces is planned and are not processed in the process chamber as the number of unprocessed work pieces; when the computed number of unprocessed work pieces is equal to or larger than a charge limit amount that is set in advance, computes transport destination candidates excluding a process chamber with the number of unprocessed work pieces equal to or larger than the charge limit amount; and computes a transport destination of the work piece from among the transport destination candidates.

2. The vacuum process device according to claim 1, wherein the charge limit amount is set to a value obtained by dividing the number of unprocessed work pieces that can be held in a holding mechanism unit provided in the load lock continuous to a transport mechanism unit connected to a process chamber or a transport buffer unit on a side closer to the atmosphere-side continuous to the transport mechanism unit with the number of all process chambers connected to the transport mechanism unit connected to the process chamber, and adding one to an obtained quotient, or a value smaller than the value.

3. The vacuum process device according to claim 1, wherein the charge limit amount is decided based on the number of work pieces that can be held in the holding mechanism unit.

4. The vacuum process device according to claim 1, wherein
the control unit has an input unit for inputting data; and
a method of computing a transport destination of the working piece responding to process time irregularity of the working piece can be selected with the input unit.

5. A vacuum process method, the method comprising:
controlling a load lock by taking a work piece by the load lock placed on an atmosphere side to a vacuum-side;
receiving and passing the work piece using a vacuum robot;
relay-transporting the work piece by interconnecting transport mechanism units; and
performing a predetermined process on the work piece in a process chamber, wherein
at the receiving and passing, and the relay-transporting of the work piece, the number of work pieces that are in process, and are being transported to the process chamber and are not processed is calculated as the number of unprocessed work pieces for each of the process chamber, and when the number of unprocessed work pieces is equal to or larger than a charge limit amount that is set in advance, transport destination candidates excluding the process chamber are computed, and a transport destination of the work piece is computed from among the transport destination candidates.

6. The vacuum process method according to claim 5, wherein the charge limit amount is set to a value obtained by dividing the number of unprocessed work pieces that can be held in a holding mechanism unit provided in the load lock continuous to a transport mechanism unit connected to a process chamber or a transport buffer unit on a side closer to the atmosphere-side continuous to the transport mechanism unit with the number of all process chambers connected to the transport mechanism unit connected to the process chamber, and adding one to an obtained quotient, or a value smaller than the value.

7. The vacuum process method according to claim 5, wherein the charge limit amount is decided based on the number of work pieces that can be held in the holding mechanism unit.

8. The vacuum process method according to claim 5, wherein
a control unit has an input unit for inputting data; and
a method of computing a transport destination of the work piece responding to process time irregularity of the work piece can be selected with the input unit.

9. A vacuum process device comprising:
a load lock that takes in a processed member placed on an atmosphere-side to a vacuum-side;
a plurality of process chambers that are connected to a transport chamber provided on the vacuum-side, and perform a predetermined process on the processed member;
a plurality of transport mechanism units provided with a vacuum robot that performs receiving and passing, and transporting of the processed member;
a buffer room that relay-carries the processed member by interconnecting the transport mechanism units;
a holding mechanism unit that is provided in the load lock and the buffer room, and holds a plurality of the processed members; and
a control unit that controls the receiving and passing, and the transporting of the processed member, wherein
the control unit reserves, for a processed member transported to the process chamber, the holding mechanism unit on a path to the process chamber, and decides a transport destination of a processed member to be transported next according to a status of the reservation.

10. The vacuum process device according to claim 9, wherein
in deciding a transport destination of the processed member, when there is a process chamber such that a holding mechanism unit on a path to the transport destination process chamber becomes reserved after reserving the holding mechanism unit next or a holding mechanism unit of a load lock or a buffer room that the processed member goes through when the processed member is transported to the process chamber becomes reserved, the control unit decides a transport destination excluding the process chamber.

11. The vacuum process device according to claim 9, wherein the control unit judges it necessary to change allocation to a process chamber after an elapse of a certain length of time in a state that the holding mechanism unit in a buffer room or a load lock on a path to the process chamber to which a processed member is planned to be transported is reserved or in a state that the number of holding mechanism units on a transport path of a processed member that are not reserved is equal to or smaller than one.

12. The vacuum process device according to claim 9, wherein
the control unit has an input unit for inputting data; and a method of computing a transport destination of the processed member responding to process time irregularity of the processed member can be selected with the input unit.

* * * * *